(12) United States Patent
Fukuda et al.

(10) Patent No.: US 10,879,501 B2
(45) Date of Patent: Dec. 29, 2020

(54) METHOD FOR MANUFACTURING ORGANIC EL DISPLAY PANEL, AND INK DRYING DEVICE

(71) Applicant: JOLED INC., Tokyo (JP)

(72) Inventors: Toshio Fukuda, Kanagawa (JP); Noriteru Maeda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/476,263

(22) PCT Filed: Jan. 10, 2018

(86) PCT No.: PCT/JP2018/000373
§ 371 (c)(1),
(2) Date: Jul. 5, 2019

(87) PCT Pub. No.: WO2018/131616
PCT Pub. Date: Jul. 19, 2018

(65) Prior Publication Data
US 2019/0355939 A1  Nov. 21, 2019

(30) Foreign Application Priority Data

Jan. 10, 2017 (JP) .................... 2017-001928

(51) Int. Cl.
*H01L 51/56* (2006.01)
*H01L 21/67* (2006.01)

(52) U.S. Cl.
CPC .......... *H01L 51/56* (2013.01); *H01L 21/6715* (2013.01)

(58) Field of Classification Search
CPC .................... H01L 51/56; H01L 21/6715
See application file for complete search history.

(56) References Cited

U.S. PATENT DOCUMENTS

| | | |
|---|---|---|
| 5,443,922 A | 8/1995 | Nishizaki et al. |
| 6,599,366 B1 | 7/2003 | Kitano et al. |
| 2004/0007173 A1 | 1/2004 | Kobayashi et al. |
| 2007/0026166 A1 | 2/2007 | Gomi |
| 2007/0072004 A1 | 3/2007 | Sakai et al. |

(Continued)

FOREIGN PATENT DOCUMENTS

| | | |
|---|---|---|
| JP | H5-163488 A | 6/1993 |
| JP | 2001-205165 A | 7/2001 |
| JP | 2003-234273 A | 8/2003 |

(Continued)

*Primary Examiner* — Timor Karimy
(74) *Attorney, Agent, or Firm* — Hauptman Ham, LLP

(57) ABSTRACT

An ink drying process includes exhausting gas from atmosphere surrounding a substrate and drying ink through placing the substrate in a predefined pressure or less to form organic functional layers. Exhausting of gas includes: reducing, during a first period, pressure of the atmosphere from standard atmospheric pressure to a first pressure higher than vapor pressure of solvent having the highest vapor pressure among solvents of the ink; and subsequently reducing, during a second period, the pressure of the atmosphere to a second pressure lower than vapor pressure of solvent having the lowest vapor pressure among the solvents. Where pressure of the atmosphere is $10^X$ Pa (X indicating a real number), a change amount average of X per unit time has a greater absolute value during the second period than during the first period.

11 Claims, 19 Drawing Sheets

(56) References Cited

U.S. PATENT DOCUMENTS

2012/0001124 A1    1/2012   Ishino et al.
2013/0082249 A1    4/2013   Kawanami et al.

FOREIGN PATENT DOCUMENTS

| | | |
|---|---|---|
| JP | 2004-47797 A | 2/2004 |
| JP | 2007-42708 A | 2/2007 |
| JP | 2007-61674 A | 3/2007 |
| JP | 2007-69140 A | 3/2007 |
| JP | 2007-90199 A | 4/2007 |
| JP | 2009-266753 A | 11/2009 |
| JP | 2010-80167 A | 4/2010 |
| JP | 2010-82562 A | 4/2010 |
| JP | 2011-34751 A | 2/2011 |
| JP | 2011-86389 A | 4/2011 |
| JP | 2012-28180 A | 2/2012 |
| JP | 2012-49283 A | 3/2012 |
| JP | 2012-519981 A | 8/2012 |
| JP | 2015-144051 A | 8/2015 |
| WO | 2010/104857 A2 | 9/2010 |
| WO | 2012/001744 A1 | 1/2012 |
| WO | 2013/015198 A1 | 1/2013 |
| WO | 2013/046265 A1 | 4/2013 | ns.

METHOD FOR MANUFACTURING ORGANIC EL DISPLAY PANEL, AND INK DRYING DEVICE

RELATED APPLICATIONS

The present application is a National Phase of International Application Number PCT/JP2018/000373, filed Jan. 10, 2018, which claims priority to JP2017-001928 filed Jan. 10, 2017.

TECHNICAL FIELD

The present disclosure relates to methods of manufacturing organic electroluminescence (EL) display panels that use organic EL elements that make use of electroluminescence of organic material, and ink drying devices used in such methods.

BACKGROUND ART

Recently, organic EL display panels in which organic EL elements are arranged in a matrix on a substrate are being realized as display panels used in display devices such as digital televisions.

In such an organic EL display panel, typically, a light emitting layer of each organic EL element and an adjacent organic EL element are partitioned by an insulating layer made of an insulating material. Each organic EL element has an element structure in which a functional film, such as a light emitting layer including an organic light emitting material, is disposed between an anode and a cathode electrode pair. When driven, a voltage is applied between the electrode pair, and as holes injected to the light emitting layer from the anode and electrons injected to the light emitting layer from the cathode recombine, light is emitted from the functional film.

Recently, as display devices have increased in size, a wet film-forming process has been proposed as a method of forming an efficient functional film, in which ink containing a functional material is applied based on a method such as an inkjet method. A wet film-forming process has merit in that positional precision when separately applying functional films does not depend on substrate size, and therefore the technical barrier to increasing display device size is relatively low. In a typical inkjet wet film-forming process, a substrate to which ink is to be applied is placed on a work table of an application device. An inkjet head is scanned over a surface of the substrate in one direction, and ink is dropped from nozzles of the inkjet head to a predefined region of the surface of the substrate. Subsequently, solvent of the ink is evaporated and the ink dried to form a functional film.

In a wet film-forming process in which a functional layer is formed by applying ink onto a substrate and drying the ink, drying the ink includes evaporating and drying the solvent. Solvent vapor pressure is lower in a peripheral portion of a film forming area than in a central portion thereof, and therefore an evaporation rate of the solvent is greater in the peripheral portion of the film forming area. As a result, there is a tendency that film thickness of a functional layer of a pixel formed in a central portion of the substrate and film thickness of a functional layer of a pixel formed in an end portion of the substrate are different from each other. Thus, when film thickness of functional layers differs between pixels of the central portion of the substrate and pixels of a peripheral portion f the substrate, properties of the functional layers are different from each other. Differences in properties of the functional layers cause in-plane luminance unevenness in an organic EL display panel.

Meanwhile, for example, Patent Literature 1 describes a reduced-pressure drying method performing a drying process under atmosphere having reduced pressure to a substrate whose surface is coated with coating liquid. In the reduced-pressure drying method, gas is exhausted from inside an airtight container through performing pressure reduction with use of flow rate setting values switched in two steps while a solvent component evaporates greatly from the coating liquid. Patent Literature 1 describes that a coating film having in-plane uniformity can be formed on a surface of a substrate. Patent Literature 2 describes a film forming method that reduces pressure of atmosphere surrounding a liquid composition placed on a substrate to a first predefined pressure and maintains the first pressure. Patent Literature 2 describes preventing disorder in a shape of the liquid composition through selectively evaporating different kinds of liquids included in mixed solvent of the liquid composition and thus obtaining a flat film.

CITATION LIST

Patent Literature

[Patent Literature 1]
  Japanese Patent Application Publication No. 2004-47797
[Patent Literature 2]
  Japanese Patent Application Publication No. 2007-69140

SUMMARY

Technical Problem

However, as panel resolution increases, in the manufacturing methods disclosed in Patent Literature 1 and Patent Literature 2, in a line bank structure in which light emitting layers are formed by applying ink into column application regions on a substrate, an effect of equalizing film thicknesses of the light emitting layers within the column application regions is small. Due to this, film thicknesses of functional layers across a substrate plane are uneven, which causes unevenness of luminance.

The present disclosure has been achieved in view of the above problems, and an aim thereof is to provide an organic EL display panel manufacturing method and an ink drying device that uses the method, for improving in-plane luminance uniformity by equalizing film thickness of light emitting layers within and between column application regions on a substrate in order to overcome film thickness difference of the light emitting layers in peripheral and central portions of the film forming area.

Solution

A method of manufacturing an organic EL display panel pertaining to an aspect of the present disclosure includes forming pixel electrode layers in a matrix on a substrate. In the method, the matrix includes rows and columns. The method further includes arranging column banks, which extend in a column direction, above the substrate along a row direction. In the method, at least a part of each of the column banks is between corresponding edges of adjacent pixel electrode layers in the row direction. The method further includes applying ink including solute and two or more kinds of solvents to gaps between adjacent column banks. In the method, the applied ink is continuous between column direction ends of the column banks in the column direction, and the solute includes a functional organic material. The method further includes exhausting gas from atmosphere surrounding the substrate. The method further includes drying the ink through placing the substrate in a state in which pressure of the atmosphere is equal to or lower than a predefined pressure. In the method, the drying forms organic functional layers. The method further includes forming a light-transmissive counter electrode layer above the organic functional layers. In the method, the exhausting of gas includes: reducing, during a first period, pressure of the atmosphere from standard atmospheric pressure to a first pressure that is higher than vapor pressure of solvent having the highest vapor pressure among the solvents; and reducing, during a second period after the first period, pressure of the atmosphere to a second pressure that is lower than vapor pressure of solvent having the lowest vapor pressure among the solvents. In the method, where pressure of the atmosphere is represented as $10^x$ Pa (where X indicates a real number), an average of a change amount of a value of X per unit time during the second period has a greater absolute value than an average of a change amount of a value of X per unit time during the first period.

An ink drying device pertaining to an aspect of the present disclosure is used for drying ink that includes solute and two or more kinds of solvents, the solute including a functional organic material, the ink being applied to gaps between adjacent ones of column banks disposed on a substrate and being continuous between column direction ends of the column banks in a column direction thereof. The ink drying device includes a chamber for receiving the substrate having ink thereon. The ink drying device further includes a support base in the chamber for supporting the substrate. The ink drying device further includes a unit for exhausting gas from the chamber. In the ink drying device, the unit for exhausting gas from the chamber is for being controlled under a profile including: a first period during which pressure in the chamber is reduced from standard atmospheric pressure to a first pressure that is higher than vapor pressure of solvent having the highest vapor pressure among the solvents; and a second period after the first period and during which pressure in the chamber is reduced to a second pressure that is lower than vapor pressure of solvent having the lowest vapor pressure among the solvents. In the ink drying device, where pressure in the chamber is represented as $10^x$ Pa (where X indicates a real number), an average of a change amount of a value of X per unit time during the second period has a greater absolute value than an average of a change amount of a value of X per unit time during the first period.

Advantageous Effects

According to the method of manufacturing the organic EL display panel pertaining to an aspect of the present disclosure, luminance uniformity across the organic EL display panel can be improved by making film thickness more uniform for light emitting layers within column shaped application regions and between column shaped application regions on a substrate in order to overcome film thickness difference of the light emitting layers in peripheral and central portions of a film forming area.

DESCRIPTION OF EMBODIMENTS

<<Overview of Embodiment of Present Disclosure>>

Figure 1:
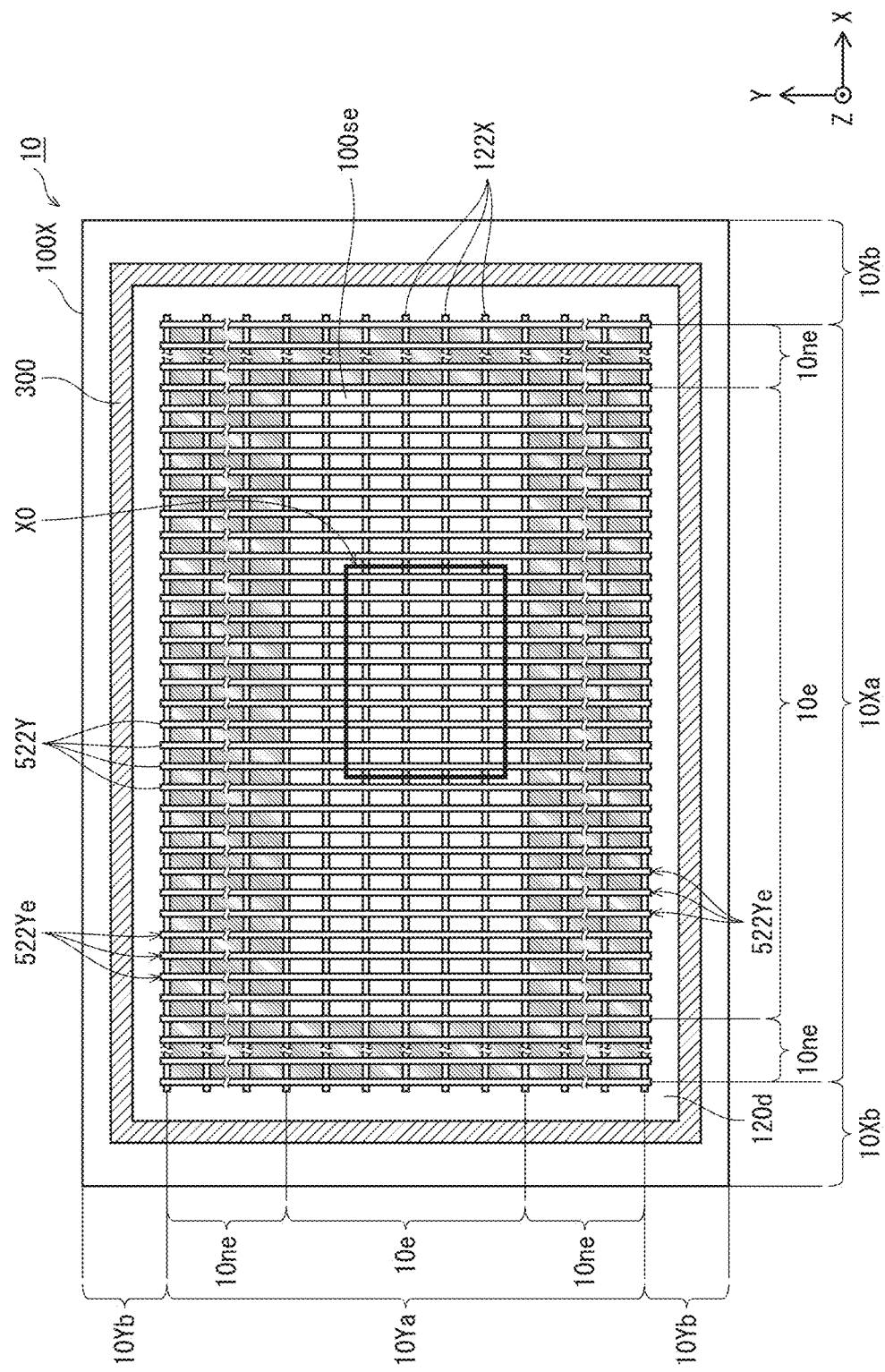
FIG. 1 is a schematic plan view of an organic EL display panel 10 manufactured by a manufacturing method pertaining to an embodiment.

A method of manufacturing an organic EL display panel pertaining to the present embodiment includes forming pixel electrode layers in a matrix on a substrate. In the method, the matrix includes rows and columns. The method further includes arranging column banks, which extend in a column direction, above the substrate along a row direction. In the method, at least a part of each of the column banks is between corresponding edges of adjacent pixel electrode layers in the row direction. The method further includes applying ink including solute and two or more kinds of solvents to gaps between adjacent column banks. In the method, the applied ink is continuous between column direction ends of the column banks in the column direction, and the solute includes a functional organic material. The method further includes exhausting gas from atmosphere surrounding the substrate. The method further includes drying the ink through placing the substrate in a state in which pressure of the atmosphere is equal to or lower than a predefined pressure. In the method, the drying forms organic functional layers. The method further includes forming a light-transmissive counter electrode layer above the organic functional layers. In the method, the exhausting of gas includes: reducing, during a first period, pressure of the atmosphere from standard atmospheric pressure to a first pressure that is higher than vapor pressure of solvent having the highest vapor pressure among the solvents: and reducing, during a second period after the first period, pressure of the atmosphere to a second pressure that is lower than vapor pressure of solvent having the lowest vapor pressure among the solvents. In the method, where pressure of the atmosphere is represented as $10^X$ Pa (where X indicates a real number), an average of a change amount of a value of X per unit time during the second period has a greater absolute value than an average of a change amount of a value of X per unit time during the first period.

Due to this configuration, film thickness of the light emitting layers to be formed becomes equivalent in both a peripheral portion and a central portion of a film forming area in column shaped application regions on the substrate. As a result, improvement can be made to luminance unevenness across a display panel surface caused by nonuniformity of film thickness of the light emitting layers in the peripheral and the central portions of the film forming area.

An ink drying device pertaining to the present embodiment is used for drying ink that includes solute and two or more kinds of solvents, the solute including a functional organic material, the ink being applied to gaps between adjacent ones of column banks disposed on a substrate and being continuous between column direction ends of the column banks in a column direction thereof. The ink drying device includes a chamber for receiving the substrate having ink thereon. The ink drying device further includes a support base in the chamber for supporting the substrate. The ink drying device further includes a unit for exhausting gas from the chamber. In the ink drying device, the unit for exhausting gas from the chamber is for being controlled under a profile including: a first period during which pressure in the chamber is reduced from standard atmospheric pressure to a first pressure that is higher than vapor pressure of solvent having the highest vapor pressure among the solvents; and a second period after the first period and during which pressure in the chamber is reduced to a second pressure that is lower than vapor pressure of solvent having the lowest vapor pressure among the solvents. In the ink drying device, where pressure in the chamber is represented as $10^X$ Pa (where X indicates a real number), an average of a change amount of a value of X per unit time during the second period has a greater absolute value than an average of a change amount of a value of X per unit time during the first period.

According to the ink drying process making use of the ink drying device pertaining to the present embodiment, film thickness of the light emitting layers to be formed becomes equivalent in both the peripheral portion and the central portion of the film forming area in the column shaped application regions on the substrate, and improvement can be made to luminance unevenness caused by nonuniformity of film thickness of the light emitting layers of the display panel.

According to an embodiment, the first period is from 30 seconds to 300 seconds and starts from a start of pressure reduction of the atmosphere. According to an embodiment, the second period is from 30 seconds to 120 seconds and starts from an end of the first period. According to an embodiment, the first pressure is selected from a range from $1 \times 10^4$ Pa to $3 \times 10^4$ Pa ($10^{4.47712}$ Pa). According to an embodiment, the second pressure is 10 Pa. According to an embodiment, the second period is within 60 seconds and starts from the end of the first period.

According to the method of manufacturing the organic EL display panel pertaining to the above embodiments, in a display panel manufactured through applying ink including a functional organic material in the column application regions on the substrate, variation in film thickness along the column direction immediately after ink application caused by variation in ink ejection amount is reduced through levelling. Further, when manufacturing the organic EL display panel through applying ink including a functional organic material in the column application regions on the substrate, effects of ink convection in the column application regions caused by imbalance of ink surface tension can be reduced through shortening time length during which such ink convection occurs. Subsequently, film shape of the light emitting layers to be formed becomes equivalent in both the peripheral portion and the central portion of the film forming area. As a result, improvement can be made to luminance unevenness caused by nonuniformity of film thickness of the light emitting layers of the display panel by equalizing film thickness of the light emitting layers in the column application regions on the substrate in order to overcome film thickness difference of the light emitting layers in the peripheral and the central portions of the film forming area.

According to an embodiment, the exhausting of gas further includes reducing, during a third period after the second period, pressure of the atmosphere to a third pressure or less. Here, the third pressure is pressure such that a value of X is 0. According to an embodiment, the predefined pressure is equal to or lower than the third pressure. Here, the drying of the ink further includes placing the substrate under the predefined pressure after the second period.

According to an embodiment, the drying of the ink further includes heating the substrate under the predefined pressure.

According to an embodiment, the drying of the ink further includes placing the substrate under the predefined pressure. An embodiment further includes subsequently heating the substrate under atmospheric pressure. An embodiment further includes a heating unit for heating the substrate. Here, the heating unit heats, after the second period, the substrate under a predefined pressure equal to or lower than the third pressure. According to such a configuration of an embodiment of the present disclosure, hole injection layers including a metal oxide can be suitably formed by using a wet process.

According to an embodiment, reduction of pressure of the atmosphere during the first period is a monotonous reduction. Here, reduction of pressure of the atmosphere during the second period is a monotonous reduction.

Embodiment

1. Overall Configuration of Display Panel 10

1.1 Overview

Display panel 10 pertaining to the present embodiment is described with reference to the drawings. The drawings are schematic diagrams and actual scale may differ.

FIG. 1 is a schematic plan view of the display panel 10.

The display panel 10 is an organic EL display panel that uses electroluminescence of an organic compound, has organic EL display elements 100, which form pixels, disposed in a matrix on a substrate 100x (thin film transistor (TFT) substrate) on which TFTs are arranged. The display panel 10 has a top-emission configuration, emitting light from an upper surface. Here, in the present disclosure, an X direction, Y direction, and Z direction in FIG. 1 correspond to a row direction, column direction, and thickness direction of the display panel 10, respectively.

As illustrated in FIG. 1, the display panel 10 has a partitioned region 10a (the X direction and the Y direction are labelled 10Xa and 10Ya, respectively, and 10a is used where the distinction is unnecessary) in which column banks 522Y and row banks 122X are disposed, partitioning the substrate 100x into a matrix and defining light emitting units of each color RGB, and a non-partitioned region 10b (the X direction and the Y direction are labelled 10Xb and 10Yb, respectively, and 10b is used where the distinction is unnecessary) surrounding the partitioned region 10a. Outer peripheral edges in the column direction of the partitioned region 10a correspond to ends 522Yc in the column direction of the column banks 522Y. In the non-partitioned region 10b is formed a sealing member 300 that is rectangular and surrounds the partitioned region 10a. Further, the partitioned region 10a includes a display element region 10e including a substrate center and a non-light emitting region 10ne surrounding the display element region 10e. The display element region 10e is a region in which the organic EL display element 100 is formed in each section defined by the column banks 522Y and the row banks 122X; and the non-light emitting region 10ne is a region in which the organic EL display element 100 is not formed in each section. Further, length in the X and Y directions of the non-light emitting region 10ne is preferably from two to ten times length in the X and Y directions of a sub pixel 100se region surrounded by adjacent ones of the column banks 522Y and adjacent ones of the row banks 122X. According to the present embodiment, the length is four times greater in both the X and Y directions.

1.2 Configuration of Display Element Region 10e

Figure 2:
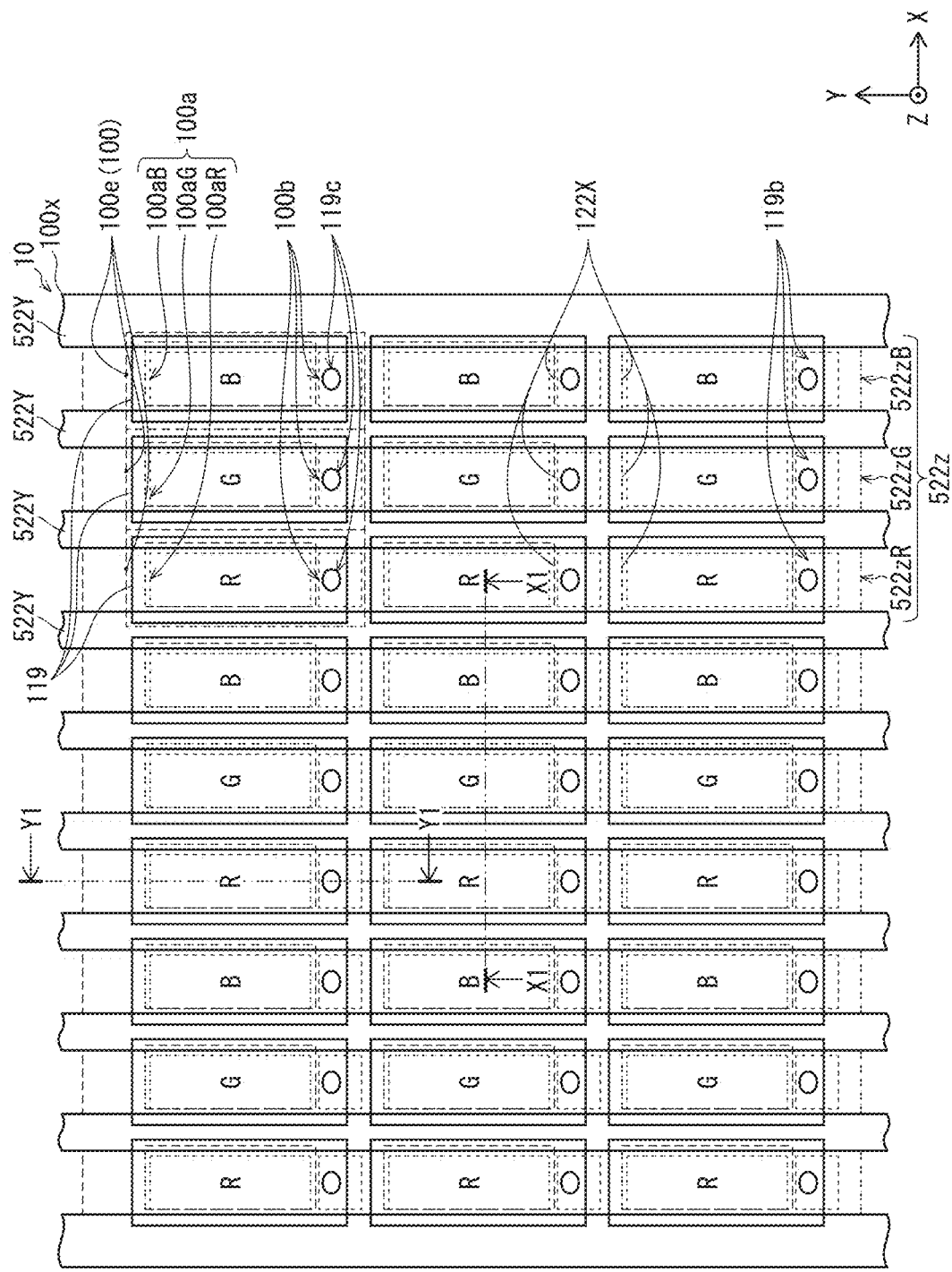
FIG. 2 is an enlarged plan view of portion X0 in FIG. 1.

FIG. 2 is an enlarged plan view of portion X0 in FIG. 1.

In the display element region 10e of the display panel 10, unit pixels 100e corresponding to the organic EL display element 100 are arranged in a matrix. In each of the unit pixels 100e are three auto light emitting regions 100a, which are regions that emit light via an organic compound, a red light emitting region 100aR, a green light emitting region 100aG, and a blue light emitting region 100aB (hereinafter, where a distinction between 100aR, 100aG, and 100aB is not necessary, 100a is used). That is, three sub pixels 100se corresponding to auto light emitting regions 100aR, 100aG, and 100aB lined up in the row direction in FIG. 2 are one set, and make up one of the unit pixels 100e in a color display.

Further, as illustrated in FIG. 2, pixel electrode layers 119 are arranged in a matrix on the substrate 100x in a state of being separated from each other by predefined distances in the row and column directions of the display panel 10. Each of the pixel electrode layers 119 has a rectangular shape in plan view. The pixel electrode layers 119 arranged in a matrix correspond to the three auto light emitting regions 100aR, 1.00aG, 100aB lined up in the row direction.

In the display panel 10, shapes of the banks 122 are that of a so-called line-like insulating layer form. The column banks 522Y extend in the column direction (Y direction FIG. 2) and are lined up in the row direction above regions on the substrate 100x between outer edges in the row direction of two adjacent ones of the pixel electrode layers 119 in the row direction.

On the other hand, the row banks 122X extend in the row direction (X direction in FIG. 2) and are lined up in the column direction above regions on the substrate 100x between outer edges in the column direction of two adjacent ones of the pixel electrode layers 119 in the column direction. A region in which the row banks 122X are formed becomes a non-auto light emitting region 100b, because organic electroluminescence does not occur in light emitting layers 123 above the pixel electrode layers 119. Thus, edges in the column direction of the auto light emitting regions 100a are defined by edges in the column direction of the row banks 122X.

Where a gap 522z between adjacent ones of the column banks 522Y is defined, a red gap 522zR corresponding to the auto light emitting region 100aR, a green gap 522zG corresponding to the auto light emitting region 100aG, or a blue gap 522zB corresponding to the auto light emitting region 100aB exists (hereinafter, where distinction between gap 522zR, gap 522zG, and gap 522zB is not required, "gap 522z" is used), and in the display panel 10 the column banks 522Y and the gaps 522z alternate in the row direction.

Further, as illustrated in FIG. 2, in the display panel 10, the auto light emitting regions 100a and the non-auto light emitting regions 100b alternate in the column direction along the gap 522z. In the non-auto light emitting region 100b, there is a connecting recess 119c (contact hole) that connects one of the pixel electrode layers 119 to a source of a TFT, and a contact region 119b (contact window) on the pixel electrode layer 119 for electrical connection to the pixel electrode layer 119.

Further, for one sub pixel 100se, the column banks 522Y and the row banks 122X intersect, and the auto light emitting region 100a is disposed between the row banks 122X in the column direction.

2. Component Configuration of Display Panel 10

Figure 3:
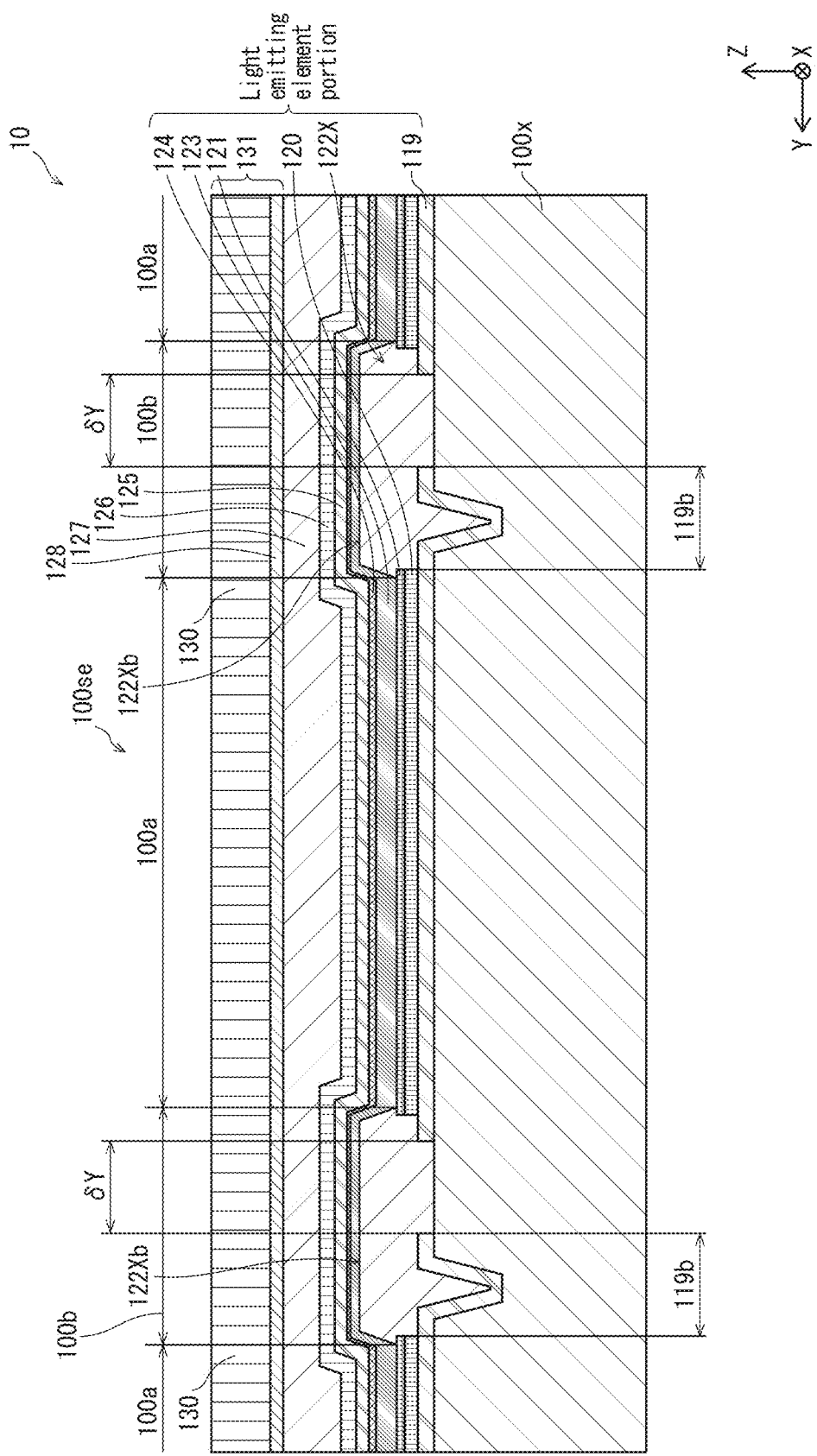
FIG. 3 is a schematic cross section taken through Y1-Y1 in FIG. 2.
Figure 4:
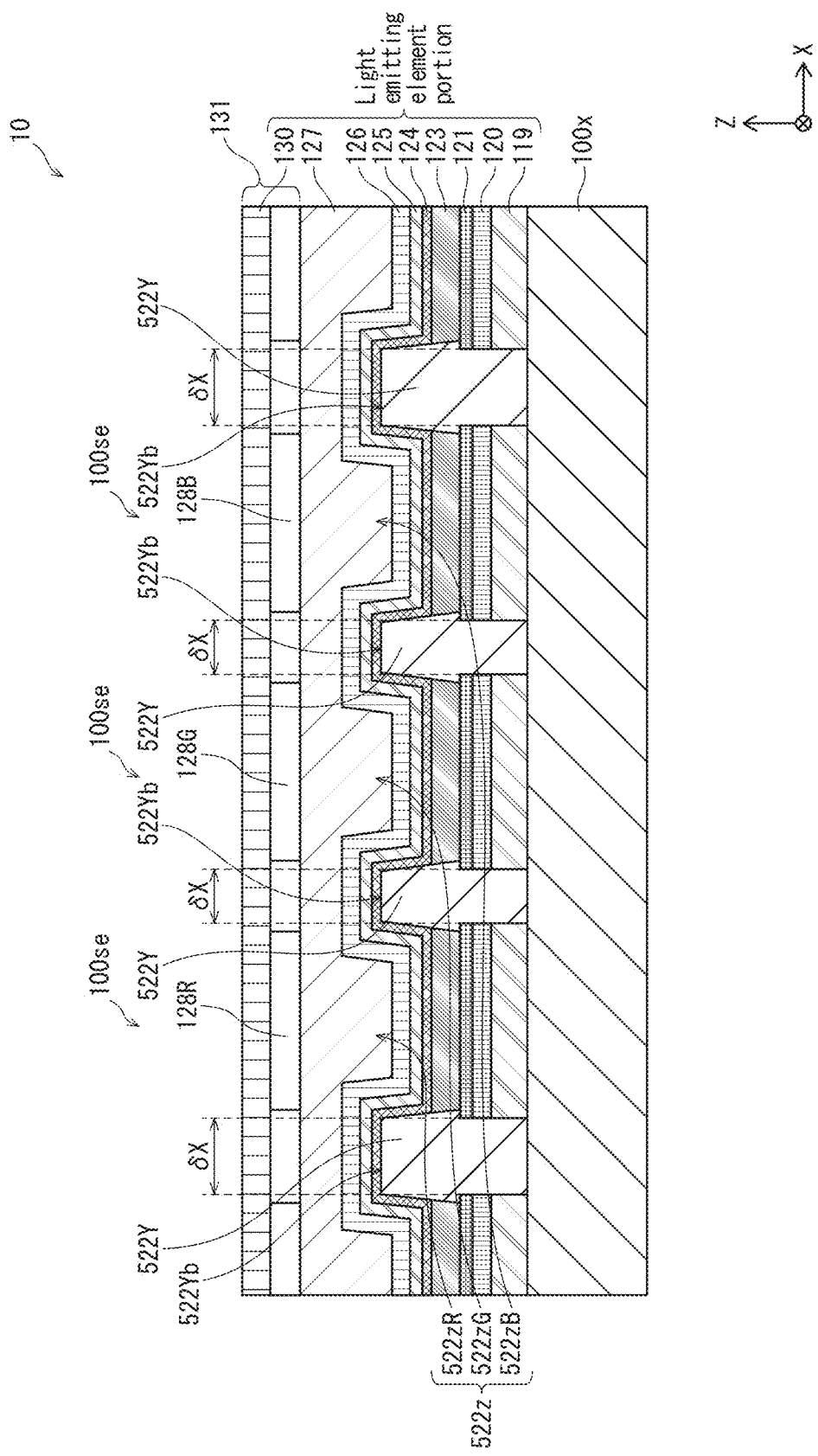
FIG. 4 is a schematic cross section taken through X1-X1 in FIG. 2.

Configuration of the organic EL display element 100 in the display panel 10 is described with reference to the schematic cross sections of FIG. 3 and FIG. 4. FIG. 3 is a schematic cross section taken along Y1-Y1 in FIG. 2. FIG. 4 is a schematic cross section taken along X1-X1 in FIG. 2.

The display panel 10 pertaining to the present embodiment is configured such that the substrate 100x (TFT substrate) on which a thin film transistor is formed is lower in the Z axis direction, above which is an organic EL element portion.

(1) Substrate 100x (TFT Substrate)

The substrate 100x is a support member of the display panel 10, and has a base (not illustrated), a TFT layer (not illustrated) on the base material, and an interlayer insulating layer (not illustrated) on the TFT layer and the base material.

The base is a support member of the display panel 10, and is a flat plate. As a material of the base, an electrically insulating material can be used, such as a glass material, a resin material, a semiconductor material, or a metal material coated with an insulating layer. As examples, a glass substrate, a silica glass substrate, a silicon substrate, a metal substrate of a metal such s molybdenum sulfide, copper, zinc, aluminum, stainless steel, magnesium, iron, nickel, gold, or silver, a semiconductor substrate such as gallium arsenide, a plastic substrate, or similar.

The TFT layer includes TFTs and wires formed on an upper layer of the base. A TFT, in accordance with a drive signal from an external circuit of the display panel 10, electrically connects one of the pixel electrode layers 119 to an external power source, and is a multilayer structure including layers such as an electrode, a semiconductor layer, and an insulating layer. The wires electrically connect the TFTs, the pixel electrode layers 119, the external power source, external circuits, and the like.

The insulating layer disposed on an upper surface of the substrate 100x planarizes at least the sub pixels 100se on the upper surface of the substrate 100x, which would otherwise be uneven due to the TFT layer. Further, the interlayer insulating layer fills space between the wiring and TFTs and electrically insulates the wiring and TFTs.

For the interlayer insulating layer above the TFTs, silicon oxide ($SiO_2$), silicon nitride (SiN) and silicon oxynitride (SiON), or silicon oxide (SiO) and silicon oxynitride (SiON) can be used, for example. As a connecting electrode layer of a TFT, a layered body of molybdenum (Mo), copper (Cu), and copper manganese (CuMn) can be used, for example. The interlayer insulating layer disposed on an upper surface of the substrate 100x is formed by using an organic compound such as polyimide resin, acrylic resin, siloxane resin, novalac-type phenolic resin, or the like. Film thickness of the interlayer insulating layer can be in the range from 2000 nm to 8000 nm.

(2) Pixel Electrode Layers 119

On the interlayer insulating layer disposed on the upper surface of the substrate 100x, the pixel electrode layers 119 are provided in units of the sub pixels 100se. The pixel electrode layers 119 supply carriers to the light emitting layers 123, for example if the pixel electrode layers function as anodes, they supply holes to the light emitting layers 123. Each of the pixel electrode layers 119 is a rectangular flat plate shape, and the pixel electrode layers 119 are disposed on the substrate 100x with an interval δX between them in the row direction and in the gaps 522z with an interval δY between them in the column direction. Further, for each of the pixel electrode layers 119, the connecting recess 119c that is recessed in the direction of the substrate 100x is connected to a source of a TFT via a contact hole provided to an upper surface of the substrate 100x.

The pixel electrode layers 119 are made of a metal material. In the case of top-emission, chromaticity of emitted light is adjusted by adoption of an optical resonator structure for which film thickness is optimally set to increase luminance, and therefore it is necessary for a surface portion of the pixel electrode layers 119 to have a high reflectivity. The pixel electrode layers 119 may have a structure in which a plurality of films selected from a metal layer, an alloy layer, and a transparent conductive layer are layered. The metal layer can be made of a metal material including silver (Ag) or aluminum (Al). The alloy layer can be made using a silver, palladium, and copper alloy (APC), a silver, rubidium, gold alloy (ARA), a molybdenum chromium alloy (MoCr), a nickel chromium alloy (NiCr), or the like. The transparent conductive layer can be made using indium tin oxide (ITO), indium zinc oxide (IZO), or the like.

(3) Hole Injection Layers 120, Hole Transport Layers 121

The hole injection layers 120 and the hole transport layers 121 are layered in this order on the pixel electrode layers 119, each of the hole transport layers 121 being in contact with one of the hole injection layers 120. The hole injection layers 120 and the hole transport layers 121 have a function of transporting holes injected from the pixel electrode layers 119 to the light emitting layers 123.

Each of the hole injection layers 120 is a layer made of an oxide such as silver (Ag), molybdenum (Mo), chromium (Cr), vanadium (V), tungsten (W), nickel (Ni), iridium (Ir), or the like, or an electrically conductive polymer material such as poly(3,4-ethylenedioxythiophene) polystyrene sulfonate (PEDOT:PSS) or the like.

The hole transport layers 121 can be made using a polymer compound such as polyfluorene, a derivative thereof, polyarylamine, a derivative thereof, or the like.

(4) Banks 122

The banks 122 are made of an insulator and are formed to cover edges of the pixel electrode layers 119, the hole injection layers 120, and the hole transport layers 121. The banks 122 include the column banks 522Y extending in the column direction and arranged along the row direction and the row banks 122X extending in the row direction and arranged along the column direction. As illustrated in FIG. 2, the column banks 522Y intersect the row banks 122X, forming a lattice shape (hereinafter, the row banks 122X and the column banks 522Y are collectively referred to as "banks 122" in some instances). Further, an upper surface 522Yb of the column banks 522Y is positioned higher than an upper surface 122Xb of the row banks 122X.

The row banks 122X each have a line-like shape extending in the row direction, and in cross section taken along the column direction have a tapered trapezoidal shape tapering upwards. The row banks 122X extend in the row direction, perpendicular to the column direction, passing through the column banks 522Y. Thus, the row banks 122X and the column banks 522Y form openings corresponding to the auto light emitting regions 100a.

The row banks 122X may not impede flow in the column direction of ink containing an organic compound that is a material of the light emitting layers 123. Thus, it is necessary for the row banks 122X to have lyophilicity with respect to the ink that is not less than a predefined value. According to this configuration, fluidity of the ink in the column direction is increased to suppress variation of applied ink amount between sub pixels. The pixel electrode layers 119 are not exposed by the row banks 122X and regions in which the row banks 122X are present do not emit light and do not contribute to luminance.

When an upper limit of film thickness of the row banks 122X is thicker than 2000 nm, wet spreading of the ink in gaps along the column banks is impeded. Meanwhile, when the upper limit of film thickness of the row banks 122X is 2000 nm or less, wet spreading of the ink is good, and when 1200 nm or less, wet spreading of the ink is further improved. Further, when a lower limit of film thickness is at least 100 nm, end portions of the pixel electrode layers 119 are covered by the banks 122, and the pixel electrode layers 119 and a counter electrode layer 125 can be manufactured at a constant yield without short-circuits. When the lower limit of film thickness is at least 200 nm, short defects occurring due to uneven bank film thickness are reduced making stable manufacturing possible. In a case in which connecting groove portions are provided in the banks 122, the same applied to film thickness at a bottom of the groove portions.

Accordingly, thickness of the row banks 122X preferably ranges from 100 nm to 2000 nm. More preferably, thickness of the row banks 122X ranges from 200 nm to 1200 nm. According to the present embodiment, thickness of the row banks 122X is approximately 500 nm.

The column banks 522Y block flow of the ink in the row direction to define row direction outer edges of the light emitting layers 123. The column banks 522Y each have a line-like shape extending in the column direction, and in cross section taken along the row direction have a tapered trapezoidal shape tapering upwards.

The column banks 522Y define outer edges in the row direction of the light emitting region 100a of each of the sub pixels 100se. Thus, the column banks 522Y require liquid repellency with respect to the ink that is not less than a predefined value.

Accordingly, the thickness of the column banks 522Y preferably ranges from 200 nm to 5000 nm. More preferably, the thickness of the column banks 522Y ranges from 200 nm to 3000 nm. The column banks 522Y need to have a height greater than the height of the row banks 122X. Specifically, the height of the column banks 522Y is greater than the height of the row banks 122X by 100 nm or greater. According to the present embodiment, the thickness of the column banks 522Y is approximately 2000 nm.

In order to prevent current leakage in the thickness direction (Z direction) between outer edges of the pixel electrode layers 119 and the counter electrode layer 125, it is necessary for the banks 122 to have an insulation property with a volume resistivity of $1 \times 10^6$ Ω cm or more. Thus, as described later, the banks 122 are configured to be made of a predefined insulating material.

The banks 122 are formed by using an organic material such as a resin, and have an insulation property. As examples of organic material used in forming the banks 122, acrylic resin, polyimide resin, novalac-type, phenolic resin, and the like may be used. The banks 122 preferably have organic solvent resistance. More preferably, the banks 122 are made using acrylic resin, for a low refractive index, which is suitable for a reflector.

Alternatively, when an inorganic material is used for the banks 122, the banks 122 is preferably made using silicon oxide (SiO), for example, when considering refractive index. Alternatively, inorganic material such as silicon nitride (SiN), silicon oxynitride (SiON), or the like can be used.

As stated above, the banks 122X have a film thickness of approximately 500 nm. However, film thickness is not limited to this example and can be in a range from 100 nm to 2000 nm, for example. Further, the banks 522Y have a film thickness of approximately 2000 nm. However, film thickness is not limited to this example and can be in a range from 100 nm to 5000 nm, for example.

Further, the banks 122 are subjected to etching processing, baking processing, and the like during the manufacturing process, and therefore it is preferable that the banks 122 are formed using a highly resistant material that does not excessively deform or alter due to such processing.

In order to make a surface liquid repellant, the surface can be treated with fluorine. Alternatively, a material containing fluorine may be used in forming the column banks 522Y. In order to lower liquid repellency of a surface of the column banks 522Y, ultraviolet irradiation may be performed on the column banks 522Y, and baking may be performed at a low temperature.

(5) Light Emitting Layer 123

The display panel 10 has a structure in which a large number of the column banks 522Y and the gaps 522z alternate with each other. In the gaps 522z, which are defined by the column banks 522Y, the light emitting layers 123 are formed extending in the column direction. In red gaps 522zR corresponding to auto light emitting regions 100aR, green gaps 522zG corresponding to auto light emitting regions 100aG, and blue gaps 522zR corresponding to auto light emitting regions 100aB, light emitting layers 123 that emit corresponding colors of light are formed.

Each of the light emitting layers 123 is a layer made of an organic compound, and has a function of emitting light via internal recombination of holes and electrons.

Only portions of the light emitting layers 123 that are supplied carriers from the pixel electrode layers 119 emit light, and therefore in regions in which the row banks 122X intervene, the row banks 122X being insulators, electroluminescence of the organic compound does not occur. Thus, only portions of the light emitting layers 123 where the row banks 122X are not present emit light, such portions correspond to the auto light emitting regions 100a, and outer edges of each of the auto light emitting regions 100a in the column direction are defined by column-direction outer edges of the row banks 122X.

Portions of the light emitting layers 123 above side surfaces and upper surfaces 122Xb of the row banks 122X, including the contact regions 119b, do not emit light, and such portions correspond to the non-auto light emitting regions 100b. The light emitting layers 123 are disposed on an upper surface of the hole transport layers 121 in the auto light emitting regions 100a, and are disposed on upper and side surfaces of the row banks 122X in the non-auto light emitting regions 100b.

As illustrated in FIG. 3, the light emitting layers 123 extend continuously not only in the auto light emitting regions 100a but also across adjacent ones of the non-auto light emitting regions 100b. In this way, when forming the light emitting layers 123, ink applied to the auto light emitting regions 100a can flow in the column direction via ink applied to the non-auto light emitting regions 100b, making equalizing of film thickness between pixels in the column direction possible. However, in the non-auto light emitting regions 100b, ink flow is suppressed to an appropriate extent by the row banks 122X. Accordingly, large amounts of unevenness in film thickness in the column direction is unlikely to occur, and luminance unevenness between pixels is improved.

As a material used for forming the light emitting layers 123, a functional organic material (light emitting organic material) that can be made into a film by a wet film-forming process needs to be used.

More specifically, as described in JPH5-163488, for example, the light emitting layers 123 are preferably made of a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

The light emitting layers 123 are formed through preparing ink including a light emitting organic material, applying the ink to the gaps 522z between column direction ends of the column banks 522Y continuously in the column direction, and then drying the ink under atmosphere having reduced pressure. The ink is made of solute including a functional layer material, and at least two kinds of solvents. Table 1 shows a plurality of kinds of solvents that can be used for the ink and their vapor pressure at a temperature of 20° C.

TABLE 1

| Solvent | Vapor pressure (20° C.) (Pa) |
|---|---|
| ethanol | 5900 |
| isopropyl alcohol | 4300 |
| toluene | 3400 |
| water | 2300 |
| xylene | 1300 |
| propylene glycol monomethyl ether | 1200 |
| ethylene glycol monomethyl ether | 830 |
| propylene glycol 1-monomethyl ether 2-acetate | 490 |
| anisole | 350 |
| mesitylene | 250 |
| 1,3-butanediol | 80 |
| 1-methyl-2-pyrrolidone | 39 |
| 1,3-dimethyl-2-imidazolidinone | 70 |
| propylene glycol | 10 |

In Table 1, vapor pressure of the plurality of kinds of solvents that can be used for the ink is in a range from 10 pascals (Pa) to 5900 Pa at the temperature of 20° C.

(6) Electron Transport Layer 124

In openings defined by the row banks 122X and the column banks 522Y, the electron transport layer 124 is formed on the light emitting layers 123. Further, according to at least one example, the electron transport layer 124 is also disposed on the upper surfaces 522Yb of the column banks 522Y that are not covered by the light emitting layers 123. The electron transport layer 124 has a function of transporting electrons injected from the counter electrode layer 125 to the light emitting layers 123. The electron transport layer 124 is made using, for example, an oxadiazole derivative (OXD), a triazole derivative (TAZ), a phenanthroline derivative (BCP, Bphen), or the like.

(7) Counter Electrode Layer 125

The counter electrode layer 125 is formed covering the electron transport layer 124. The counter electrode layer 125 is formed to be continuous across the display panel 10, and may be connected to bus bar wiring (not illustrated) for each pixel or each unit of a number of pixels. The counter electrode layer 125 forms a conduction path paired with the pixel electron layers 119, sandwiching the light emitting layers 123. The counter electrode layer 125 supplies carriers to the light emitting layers 123, for example in the case of the counter electrode layer 125 functioning as a cathode, the counter electrode layer 125 supplies electrons to the light emitting layers 123. The counter electrode layer 125 is formed following a surface of the electron transport layer 124, and forms an electrode common to all the light emitting layers 123. The counter electrode layer 125 is made of an electrically conductive light transmissive material. For example, indium tin oxide (ITO), indium zinc oxide (IZO), or the like can be used. Alternatively, an electrode of thin film silver (Ag), aluminum (Al), or the like may be used.

(8) Sealing Layer 126

The sealing layer 126 is formed covering the counter electrode layer 125. The sealing layer 126 is for suppressing deterioration of the light emitting layers 123 due to contact with moisture, air, and the like. The sealing layer 126 is provided covering an upper surface of the counter electrode layer 125, across the display panel 10. The sealing layer 126 can be formed using a light-transmissive material such as silicon nitride (SiN), silicon oxynitride (SiON), or the like. Further, in addition to a layer formed by using a material such as silicon nitride (SiN), silicon oxynitride (SiON), or the like, a sealing resin layer may be provided, the sealing resin layer is made of a resin material such as acrylic resin, silicone resin, or the like.

(9) Joining Layer 127

Above the sealing layer 126 in the Z axis direction is a color filter (CF) substrate 131. The CF substrate includes an upper substrate 130 and, on a lower side surface of the upper substrate in the Z axis direction, a color filter layer 128. The CF substrate 131 is joined to the sealing layer 126 by a joining layer 127. The joining layer 127 has a function of joining a "back panel" formed by each layer from the substrate 100x to the sealing layer 126 to the CF substrate 131, and has a function of preventing each layer from being exposed to moisture or air. The joining layer 127 can be made of a light transmissive resin material such as acrylic resin, silicone resin, epoxy resin, or the like.

(10) Upper Substrate 130

The CF substrate 131, which includes the upper substrate 130 and the color filter layer 128, is disposed above and joined to the joining layer 127. The display panel 10 is a top-emission type of panel, and therefore the upper substrate 130 is made using a light transmissive material such as cover glass, light transmissive resin film, or the like. Further, the upper substrate 130 can improve rigidity of the display panel 10, and help prevent intrusion of moisture, air, and the like. As a light transmissive material, a glass substrate, a silica glass substrate, a plastic substrate, or the like can be used.

(11) Color Filter Layer 128

The color filter layer 128 is formed on the upper substrate at positions corresponding to the auto light emitting regions 100a of pixels. The color filter layer 128 is a light transmissive layer provided for allowing transmission of visible light of wavelengths corresponding to R, G, and B and has a function of transmitting light emitted from each color pixel and correcting chromaticity of the transmitted light. For example, red, blue, and green color filter layers 128R, 128G, and 128B are formed above the auto light emitting regions 100aR in the red gaps 522zR, the auto light emitting regions 100aG in the green gaps 522zG, and the auto light emitting regions 100aB in the blue gaps 522zB, respectively. The color filter layer 128, more specifically, is formed by application of ink to the upper substrate 130, which is cover glass formed with a matrix of openings that correspond to pixels, the ink containing color filter material and solvent.

3. Ink Drying Device (1) Overall Configuration

The following describes configuration of an ink drying device used in the method of manufacturing the display panel 10.

Functional layers such as the hole transport layers 121 and the light emitting layers 123 are formed through applying ink including a functional organic material to the gaps 522z between the column banks 522Y and then drying the ink under atmosphere having pressure reduced to low vacuum or lower pressure. The ink is made of solute including a functional layer material, and at least two kinds of solvents.

Figure 5:
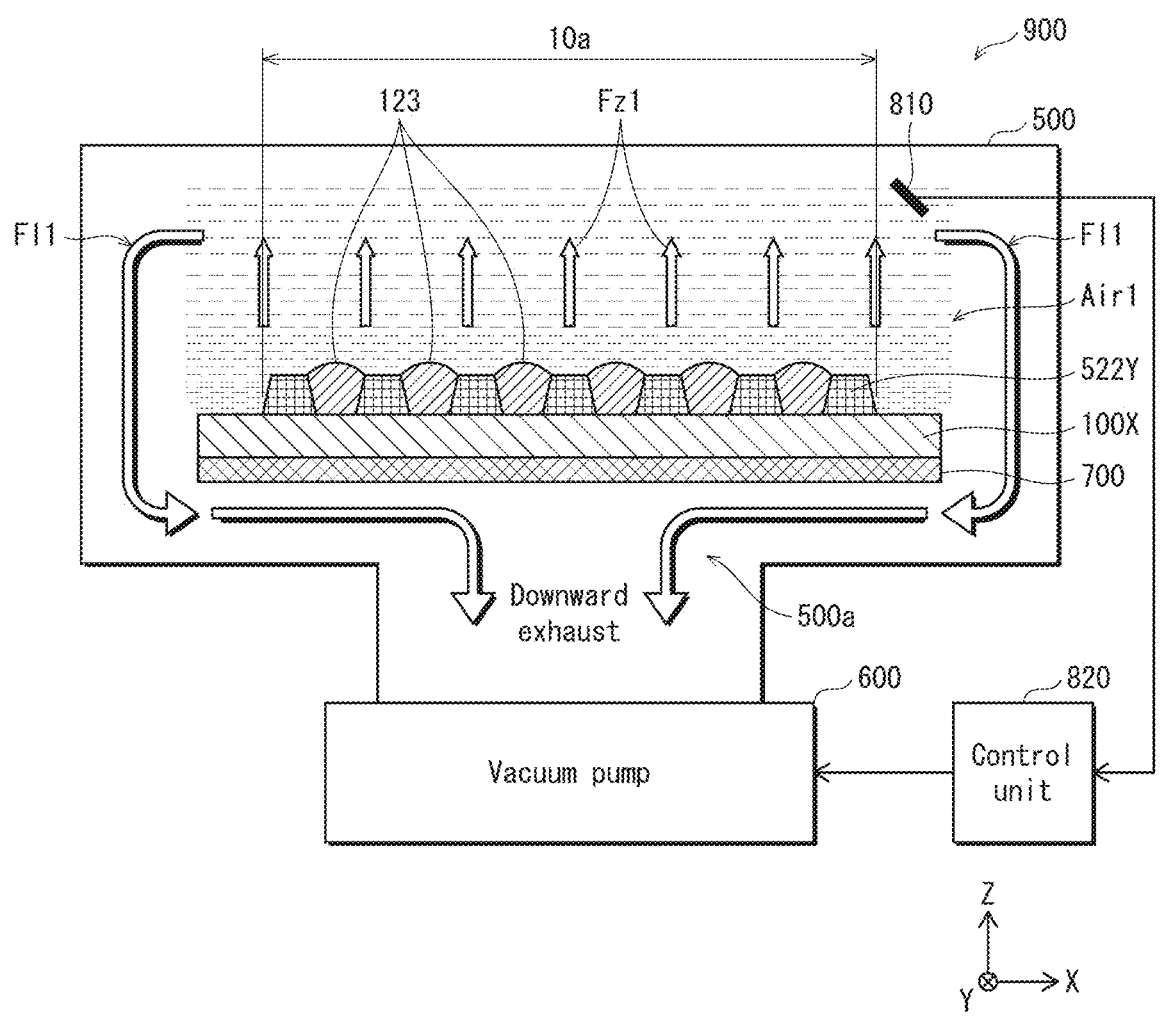
FIG. 5 is a schematic cross section of an ink drying device 900 used in method of manufacturing organic EL display panel 10 pertaining to an embodiment.

FIG. 5 is a schematic cross section of an ink drying device 900 used in the method of manufacturing the organic EL display panel 10 according to the present embodiment.

The ink drying device 900 is a device for manufacturing the light emitting layers 123, in an ink drying process described later, by a drying and baking process applied to ink containing a functional organic material under reduced pressure, the ink filling the gaps 522z between the column banks 522Y on the substrate 100x. Further, ink including a functional organic material may be baked after being dried under reduced pressure.

As illustrated in FIG. 5, the ink drying device 900 includes a chamber 500 that accommodates the substrate 100x with ink containing a functional organic material applied in the gaps 522z between the column banks 522Y, and a support base 700 on which the substrate 100x is placed in the chamber 500. The support base 700 is made of a plate of a very heat resistant metal or ceramic. The support base 700 is movable in both directions in an out of the chamber 500 via a drive unit (not illustrated).

The ink drying device 900 further includes a vacuum pump 600 that is connected to the chamber 500 and sucks gas from the chamber 500 to exhaust the gas out of the chamber 500. In cases where the ink is baked after being dried under reduced pressure, the ink drying device 900 may further include a heater (not illustrated) that heats the substrate 100x on the support base 700. The heater can be a hotplate disposed on the support base 700, and can be an oven that heats the interior of the chamber 500.

Preferably, an opening 500a to an exhaust path to the vacuum pump 600 in the chamber 500 is located below the support base 700. As illustrated in FIG. 5, a gas current can be formed that wraps around the support base 700, and vapor Air1 can be exhausted upwards in a partitioned region 10a in which the column banks 522Y and the row banks 122X are disposed, which regulate light emitting units in the colors R, G, and B.

For the vacuum pump 600, a known pump such as a cryopump or a mechanical booster pump can be used. The vacuum pump 600 may include pump mechanisms that operate independently from each other. For example, the vacuum pump may cause exhaust systems such as a main exhaust system and a sub exhaust system to operate selectively or simultaneously.

Inside the chamber 500 is a pressure sensor 810 measuring pressure inside the chamber 500. The ink drying device 900 includes a control unit 820 that sets a rotation speed or the like of the vacuum pump 600 on the basis of pressure measured by the pressure sensor 810 and drives the vacuum pump 600. The vacuum pump 600 is controlled by the control unit 820 so that an output of the pressure sensor 810 shows a predefined pressure change curve (profile).

(2) Reduced Pressure Profile

Figure 6:
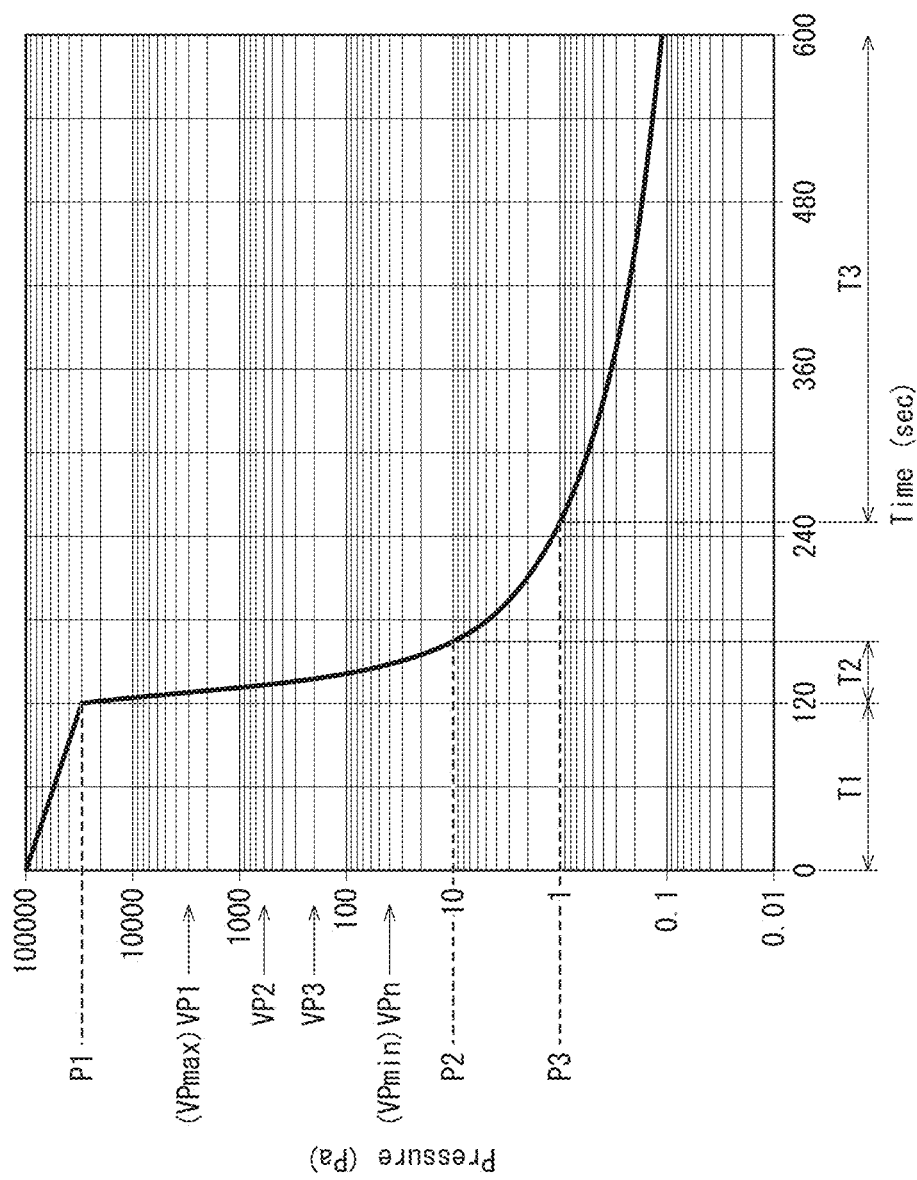
FIG. 6 is a graph of change over time of pressure in a chamber in an ink drying process.

The following describes configuration of a reduced pressure profile of the ink drying device 900. FIG. 6 is a graph of change over time of pressure in the chamber in the ink drying process. As illustrated in FIG. 6, a process of exhausting gas from the chamber 500 is characterized in including at least periods T1, T2, and T3 described in the following. The periods T1, T2, and T3 respectively indicate a first period, a second period, and a third period.

The period T1 is a period during which pressure in the chamber 500 is reduced from standard atmospheric pressure $1 \times 10^5$ Pa to P1 that is higher than vapor pressure VPmax. VPmax is vapor pressure of solvent having the highest vapor pressure among vapor pressure VP1, VP2, . . . VPn of a plurality of kinds of solvents included in the ink. Preferably, P1 is selected from a range from $1 \times 10^4$ Pa to $3 \times 10^4$ Pa ($10^{4.47712}$ Pa). Through selecting P1 from the range from $1 \times 10^4$ Pa to $3 \times 10^4$ Pa ($10^{4.47712}$ Pa), P1 can be set to be higher than VPmax. Further, the period T1 is from 30 seconds to 300 seconds in duration, and starts from a start of pressure reduction in the chamber 500. According to the present embodiment, the period T1 is 120 seconds.

The period T2 is a period after the period T1 during which pressure in the chamber 500 is reduced to P2 that is lower than vapor pressure VPmin. VPmin is vapor pressure of solvent having the lowest vapor pressure among the vapor pressure VP1, VP2, . . . VPn of the plurality of kinds of solvents included in the ink. P2 is 10 Pa, and through setting P2 to 10 Pa, P2 can be set to pressure lower than VPmin. Further, preferably, the period T2 is from 30 seconds to 120 seconds in duration, and starts from an end of the period T1. More preferably, the period T2 is 60 seconds or less in duration, and starts from the end of the period T1.

Further, as illustrated in FIG. 6, when change over time of pressure in the chamber 500 is represented through indicating pressure in the chamber 500 in a logarithmic scale, a gradient of pressure profile in the period T2 inclines more greatly than a gradient of pressure profile in the period T1. That is, an average of the gradient of change over time of pressure in the chamber 500 in the period T2 has a greater absolute value than an average of the gradient of change over time of pressure in the chamber 500 in the period T1. In other words, in terms of a relationship between the period T1 and the period T2, where pressure in the chamber 500 is represented as $10^X$ Pa (where X indicates a real number), an average of a change amount of a value of X per unit time during the period T2 has a greater absolute value than an average of a change amount of a value of X per unit time during the period T1. This enables, in the ink drying process, reduction of variation in film thickness along the column direction immediately after ink application caused by factors such as variation in ink ejection amount and non-ejection of ejection openings in ink application. Further, this can reduce effects of ink convection in the column application regions on the substrate caused by imbalance of ink surface tension. Details of the ink drying process are described later.

Further, preferably, pressure reduction during the period T1 is a monotonous reduction and pressure reduction during the period T2 also is a monotonous reduction.

The process of exhausting gas from the chamber 500 further includes, after the period T2, a period T3 for reducing pressure in the chamber 500 to P3 and causing the ink to be dried through placing the substrate 100x in a state in which the pressure of atmosphere in the chamber 500 is P3 or less. P3 is a third pressure such that X is 0 (1 Pa). The ink drying device 900 may further include a heater (not illustrated) that heats the substrate 100x on the support base 700 with the substrate 100x placed under pressure of P3 or less.

4. Method of Manufacturing the Display Panel 10

Figure 7:
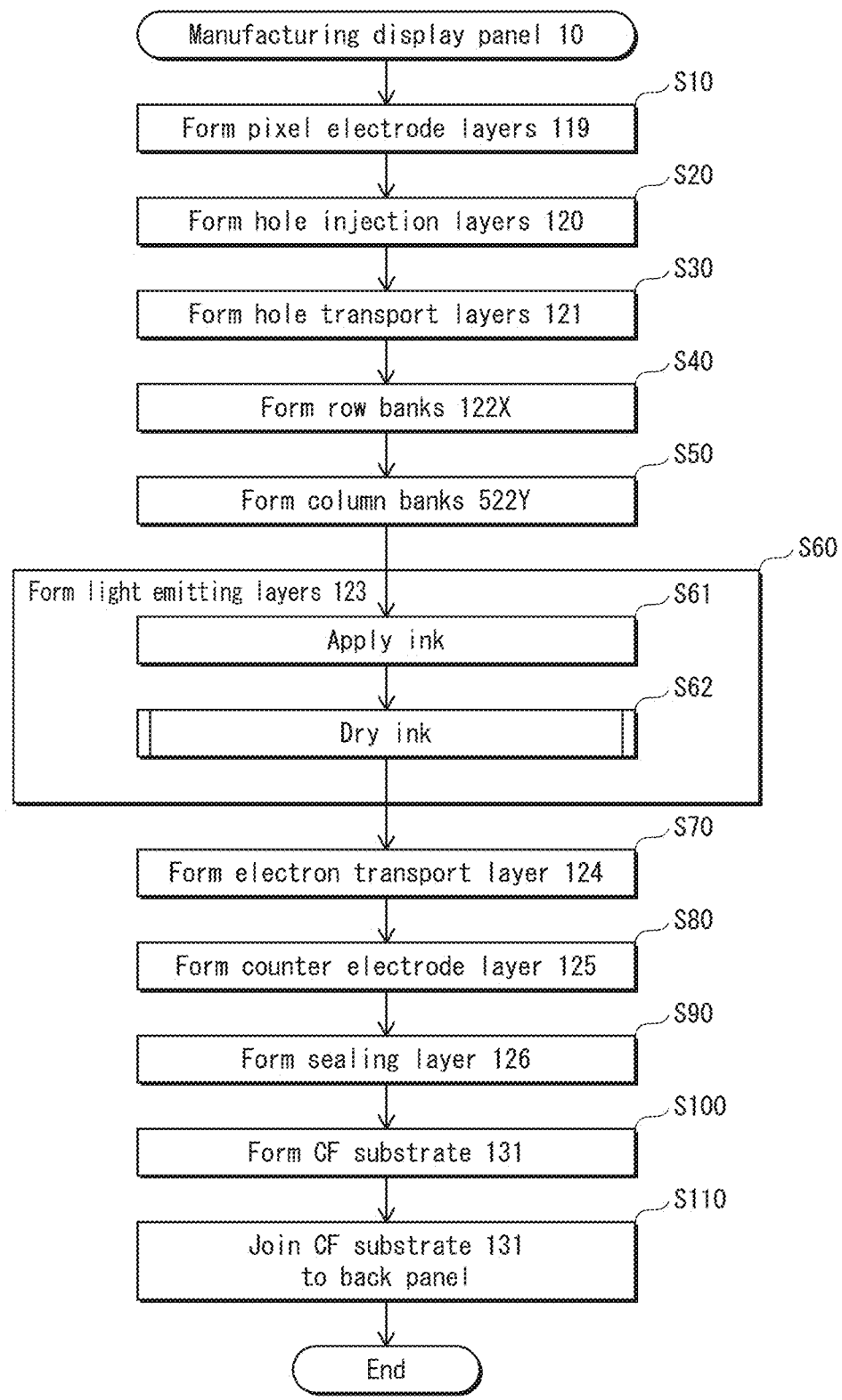
FIG. 7 is a flowchart of a process of manufacturing display panel 10.

The following describes a method of manufacturing the display panel 10. FIG. 7 shows a process of manufacturing the display panel 10. FIG. 8A to FIG. 8D, FIG. 12A, and FIG. 12B are schematic cross sections taken at the same position as Y1-Y1 in FIG. 2, showing states in manufacture of the organic EL display panel 10.

(1) Forming the Pixel Electrode Layers 119

Figure 8A:
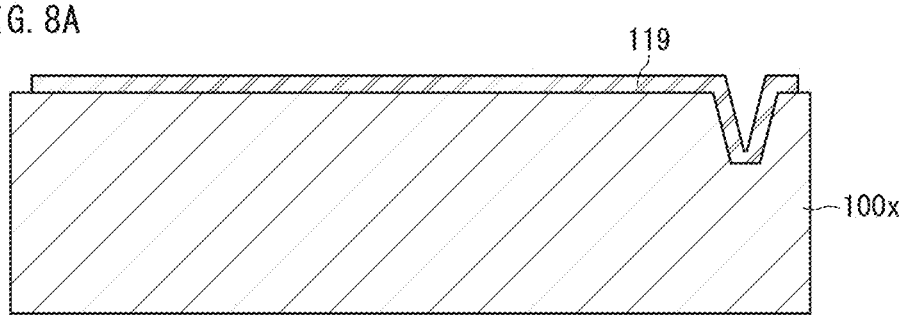
FIG. 8A to FIG. 8D are schematic cross sections taken at the same position as Y1-Y1 in FIG. 2, showing states in manufacture of organic EL display panel 10.

Initially, as illustrated in FIG. 7 and FIG. 8A, the TFT substrate 100x is prepared as far as forming an interlayer insulating layer. Contact holes are formed in the interlayer insulating layer, and the pixel electrode layers are formed (S10).

The pixel electrode layers 119 are formed by forming a metal film by using sputtering, vacuum deposition, or the like, and then patterning the metal film by using photolithography and etching, or the like. The pixel electrode layers 119 are electrically connected to TFT electrodes.

(2) Forming Hole Injection Layers 120 and Hole Transport Layers 121

Figure 8B:
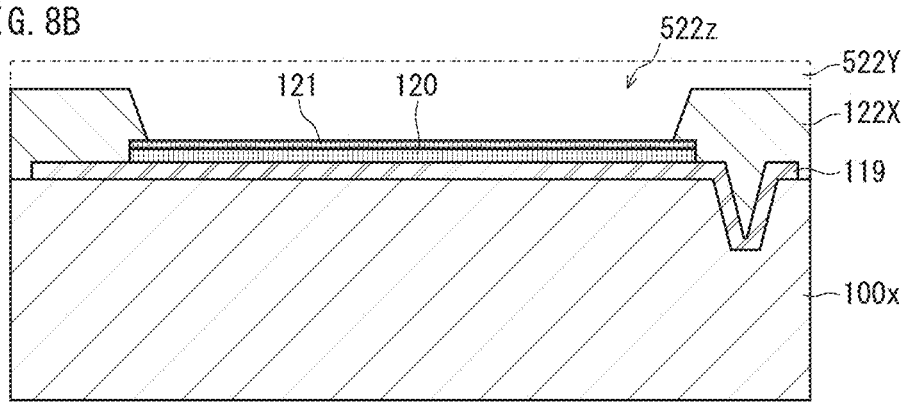

Next, as shown in FIG. 8B, the hole injection layers 120 and the hole transport layers 121 are formed on the pixel electrode layers 119 (steps S20, S30). The hole injection layers 120 and the hole transport layers 121 are formed by forming a film made of a metal oxide (for example, tungsten oxide) by using sputtering or depositing a film made of a metal (for example, tungsten) by using sputtering then oxidating the film by firing under atmosphere having reduced pressure or under atmospheric pressure.

Alternatively, the hole injection layers 120 may be formed through: forming the column banks 522Y described later; applying, by using an inkjet method, ink including an electrically conductive polymer material such as poly(3,4-ethylenedioxythiophene) polystyrene sulfonate (PEDOT: PSS) into the gaps 522z, which are defined by the column banks 522Y; and removing solvent through volatilization under atmosphere having reduced pressure (the pressure P3 in FIG. 6). After that, baking under atmospheric pressure may further be performed. Baking under atmospheric pressure can be performed through, after partially removing the solvent through volatilization under atmosphere having reduced pressure, taking the substrate 100x outside the chamber 500. Through performing baking under atmospheric pressure, hole injection layers including a metal oxide can be suitably formed by using a wet process.

Further, the hole transport layers 121 may be formed through: forming the column banks 522Y described later; applying, by using a wet process through an inkjet method or gravure printing method, ink including a material of the hole transport layers 121 into the gaps 522z defined by the column banks 522Y; and removing solvent through volatilization under atmosphere having reduced pressure (the pressure P3 in FIG. 6). After that, baking under atmosphere having reduced pressure may further be performed.

Subsequently, patterning of each pixel unit may be performed by using photolithography and etching.

(3) Forming Banks 122

As illustrated in FIG. 8B, the banks 122 are formed covering edges of the hole transport layers 121. In forming the banks 122, initially the row banks 122X are formed (step S40), then the column banks 522Y are formed in order to form the gaps 522z that define pixels (step S50). In the gaps 522z, a surface of each of the hole transport layers 121 is exposed between the row banks 122X.

To form the banks 122, first, a film made of a material of the banks 122 (for example, a photosensitive resin material) is layered on the hole transport layers 121. Then the resin film is patterned to form the row banks 122X and the column banks 522Y in order. Patterning of the row banks 122X and the column banks 522Y is performed by exposure to light of the resin film from above while using a photomask, developing, and firing (at approximately 230° C. for 60 min).

More specifically, initially, when forming the row banks 122X, a photosensitive resin film made of an organic photosensitive resin material such as acrylic resin, polyimide resin, novalac-type phenolic resin, or the like is formed by using a spin coating method or the like. After drying to partially volatize solvent, a photomask provided with predefined openings is overlaid, and ultraviolet light irradiation is performed from above to expose a photoresist made of a photosensitive resin or the like, transferring the pattern of the photomask to the photoresist. Next, the photosensitive resin is developed to form patterned insulating layers of the row banks 122X. Typically, a positive type of photoresist is used. A positive type of photoresist is removed by developing portions exposed to light. Portions of the mask pattern that are not exposed to light are not developed, leaving the row banks 122X having a film thickness of approximately 500 nm.

When forming the column banks 522Y, initially, a spin coating method is used to form a film made of material of the column banks 522Y (for example, a photosensitive resin material). Then the resin film is patterned to form the column banks 522Y and the gaps 522z. The gaps 522z are formed by positioning a mask above the resin layer, performing light exposure, and developing. The column banks 522Y extend in the column direction and alternate in the row direction with the gaps 522z.

The column banks 522Y block flow, in the row direction, of ink containing an organic compound that is a material of the light emitting layers 123, in order to define outer edges of the light emitting layers 123 in the row direction, and therefore it is necessary for the column banks 522Y to have liquid repellency with respect to the ink of at least a predefined value. On the other hand, in order for the row banks 122X to control flow of the ink in the column direction, it is necessary for the row banks 122X to have lyophilicity with respect to the ink of at least a predefined value.

In order to provide surfaces of the column banks 522Y with liquid repellency, surfaces of the column banks 522Y can be CF4 plasma treated. Alternatively, a material containing fluorine may be used in forming the column banks 522Y, or a composition including a material containing fluorine may be used in forming the column banks 522Y.

In terms of manufacturing, an upper limit of film thickness of the row banks 122X of 1000 nm or less further reduces film thickness variation and allows better control of bottom line width. Further, as film thickness becomes thinner, it is necessary for the film thickness and bottom line width to become equivalent, and at a lower limit of film thickness of 200 nm or more, obtaining a desired bottom line width due to resolution restrictions is possible. From the perspective of manufacturing, the thickness of the row banks 122X preferably ranges from 200 nm to 1000 nm, for example. According to the present embodiment, thickness of the row banks 122X is approximately 500 nm.

From the perspective of manufacturing, an upper limit of film thickness of the column banks 522Y is preferably 1500 nm or less, in order to improve productivity due to cost reduction. Further, as film thickness becomes thinner, it is necessary for the film thickness and bottom line width to become equivalent, and at a lower limit of film thickness of 1000 nm or obtaining a desired bottom line width due to resolution restrictions is possible. In the case of a process involving application of a solution, unevenness of an underlayer improves uniformity of film thickness. Accordingly, the lower limit of film thickness of insulating film is determined by the necessity of reducing step difference of TFTs as much as possible, and is preferably 500 nm or more. Accordingly, from the perspective of manufacturing, the thickness of the column banks 522Y preferably ranges from 500 nm to 1500 nm, for example. According to the present embodiment, thickness of the column banks 522Y is approximately 1000 nm.

(4) Forming Light Emitting Layers 123

Figure 8C:
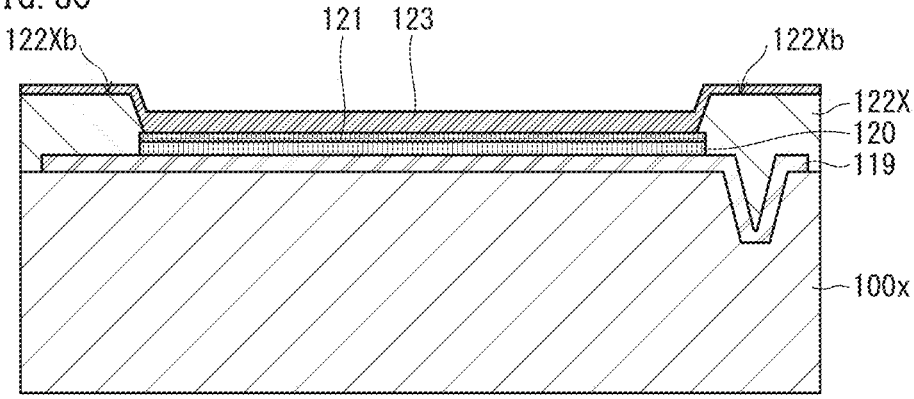

As illustrated in FIG. 8C, the light emitting layers 123 are layered on the hole transport layers 121 in the gaps 522z defined by the column banks 522Y (step S60).

Forming of the light emitting layers 123 is performed by using an inkjet method to apply ink containing organic light emitting material into the gaps 522z defined by the column banks 522Y (step S61), then drying the ink by baking (step S62).

More specifically, in this process, inks 123RI, 123GI, and 123BI containing R, G, and B organic light emitting layer material, respectively, are applied by an inkjet method to the gaps 522z, which are sub pixel formation regions. The inks are then dried under reduced pressure and baked to form the light emitting layers 123R, 123G, and 123B (FIG. 8C).

(4-11) Ink Application Process (step S61)

In application of ink of the light emitting layers 123, first, a solution for forming the light emitting layers 123 is applied by using a droplet ejecting device. Upon completion of application of ink for forming any one of the red light emitting layers, the green light emitting layers, and the blue light emitting layers on the substrate 100x, another color of ink is applied to the substrate 100x, then the third color of ink is applied to the substrate 100x, and in this way the three colors of ink are applied in sequence. As a result, red light emitting layers, green light emitting layers, and blue light emitting layers alternate across the substrate 100x.

Figure 9:
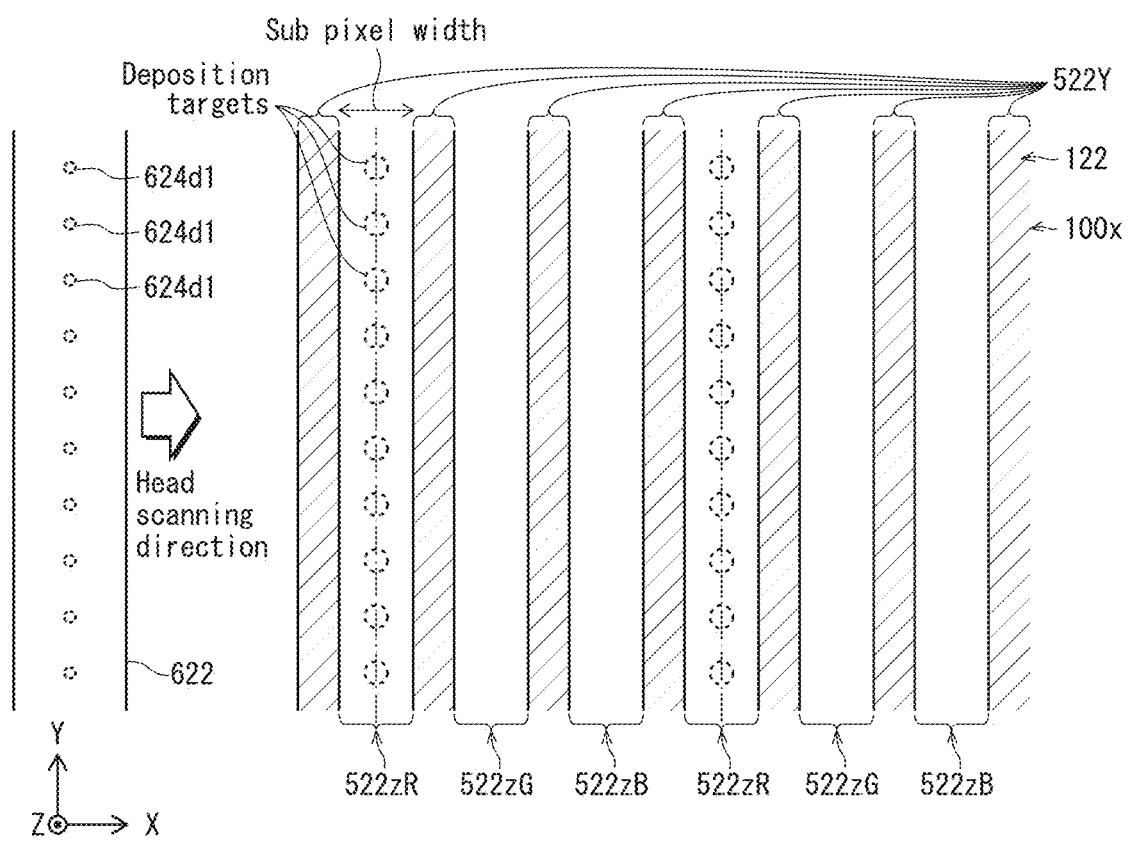
FIG. 9 is a diagram of applying ink for forming light emitting layers on a substrate during manufacture of organic EL display panel 10, in which the ink is applied to gaps 522*z* between column banks 122X.

The following describes in detail an inkjet method for applying inks of the light emitting layers 123 into the gaps 522z. FIG. 9 is a schematic diagram showing application of ink for forming light emitting layers on a substrate, in a case of uniformly applying ink to the gaps 522z between the column banks 522Y.

When forming the light emitting layers 123, using inks that are solutions for forming the light emitting layers 123, the light emitting layers 123R in the gaps 522zR for red sub pixels, the light emitting layers 123G in the gaps 522zG for green sub pixels, and the light emitting layers 123B in the gaps 522zB for blue sub pixels are formed in regions between the column banks 522Y. Thicknesses of the light emitting layers 123R, the light emitting layers 123G, and the light emitting layers 123B are different from each other. More specifically, an amount of ink applied into the gaps 522zR is greater than an amount applied to the gaps 522zB and greater than an amount applied to the gaps 522zG, and therefore thickness of the light emitting layers 123R is greater than thickness of the light emitting layers 123B and greater than thickness of the light emitting layers 123G.

In order simplify description, an amount of ink to be ejected from nozzles is set to a first condition, then ink is applied to first color gaps on the substrate, then an amount of ink to be ejected from nozzles is set to a second condition, then ink is applied to second color gaps on the substrate, then an amount of ink to be ejected from nozzles is set to a third condition, then ink is applied to third color gaps on the substrate, and by this method ink is sequentially applied to all three colors of gaps. When application of ink to the first color gaps on the substrate is finished, ink is applied to the second color gaps on the substrate, then ink is applied to the third color gaps on the substrate, thereby sequentially applying inks for three colors of gaps.

Alternatively, inks for three colors of gaps may be sequentially applied such that, when application of ink to the first color gaps of a plurality of substrates is finished, ink is applied to the second color gaps of the plurality of substrates, then ink is applied to the third color gaps of the plurality of substrates.

Alternatively, inks for three colors of gaps on a substrate may be applied such that an amount of ink to be ejected from nozzles is set to a first condition, then ink is applied to a first color gap on the substrate, then an amount of ink to be ejected from nozzles is set to a second condition, then ink is applied to an adjacent second color gap on the substrate, then an amount of ink to be ejected from nozzles is set to a third condition, then ink is applied to an adjacent third color gap on the substrate, then an amount of ink is reset to the first condition, then ink is applied to an adjacent first color gap on the substrate, and so on, until ink is applied to all gaps on the substrate.

(Method of Uniformly Applying Ink to Gaps 522z Between Column Banks 522Y)

The following describes a method of applying ink to the gap of one color (for example, ink for a red gap).

The light emitting layers 123 extend continuously not only in the auto light emitting regions 100a but also across adjacent ones of the non-auto light emitting regions 100b. In this way, when forming the light emitting layers 123, ink applied to the auto light emitting regions 100a can flow in the column direction via ink applied to the non-auto light emitting regions 100b, and film thickness of the light emitting layers 123 can be equalized between pixels in the column direction through performing an ink drying process according to the present embodiment (the ink drying process is described later). However, in the non-auto light emitting regions 100b, ink flow is suppressed to an appropriate extent by the row banks 122X. Accordingly, large amounts of unevenness in film thickness in the column direction is unlikely to occur, luminance unevenness between pixels is improved, and life of pixels is improved.

In the present application method, as illustrated in FIG. 9, the substrate 100x is placed on a work table of a droplet ejecting device in a state in which the column banks 522Y extend along the Y direction, and an inkjet nozzle head 622 in which ejection openings 624dl are arranged in a line along the Y direction is scanned across the X direction while ink aimed at deposition targets set in the gaps 522z between the column banks 522Y is deposited from the ejection openings 624dl.

For one application amount, regions to which ink of the light emitting layers 123 are applied are one out of every three regions in the X direction.

Methods of forming the light emitting layers 123 are not limited to these examples, and ink may be dropped and applied by a publicly known method other than an inkjet method or gravure printing method, such as a dispenser method, a nozzle coating method, a spin coating method, intaglio printing, letterpress printing, or the like.

(4-2) Ink Drying Method (step S62)

Figure 10:
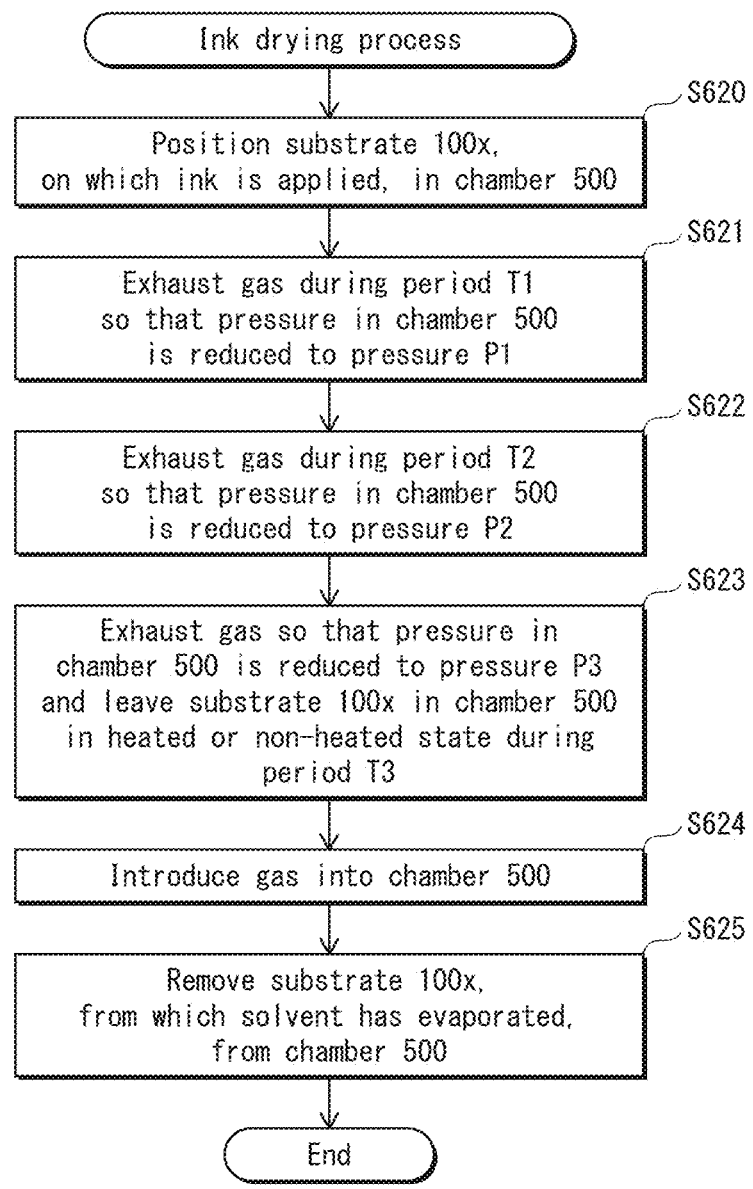
FIG. 10 is a flowchart of a detailed ink drying process in manufacture of organic display panel 10.

The following describes an ink drying process of drying applied ink by baking. FIG. 10 is a flowchart of a detailed ink drying process in manufacture of the organic EL display panel 10.

In step S620, the substrate 100x, onto which ink containing organic light emitting material is applied in the gaps 522z between the column banks 522Y, is placed on the support base 700 and the support base 700 is moved into the chamber 500 by a drive unit (not illustrated) so that the substrate 100x is inside the chamber 500. Here, the rectifying plate may be moved downward from above in the chamber 500 by the elevation unit (not illustrated), to be held by the spacers provided around the support base 700, in order to regulate the gap between the support base 700 and the rectifying plate to a predefined distance.

In step S621, the vacuum pump 600 is driven to reduce pressure in the chamber 500 from atmospheric pressure to P1. As illustrated in FIG. 6, according to the present embodiment, pressure in the chamber 500 starting from standard atmospheric pressure $1 \times 10^5$ Pa is gradually reduced to approximately $3 \times 10^4$ Pa ($10^{4.4712}$ Pa) (P1) in the period T1 of approximately 120 seconds, and then is reduced to approximately 0.1 Pa after around 600 seconds from the start of pressure reduction. That is, P1 is set to pressure that is higher than VPmax (vapor pressure of solvent having the highest vapor pressure among the plurality of kinds of solvents included in the ink), and pressure in the chamber 500 can be maintained higher than P1 during the predefined period T1.

This enables maintaining high vapor concentration of atmosphere surrounding the substrate 100x and thus suppressing evaporation of the solvent of the ink from the partitioned region 10a on the substrate 100x. Accordingly, the ink in the gaps 522z of the substrate 100x is allowed to move in the column direction, and film thickness of the ink applied in the gaps 522z is leveled. That is, levelling of films formed through ink application is achieved in the column direction through maintaining, immediately after applying the ink, high vapor concentration of atmosphere surrounding the substrate 100x. As a result, variation in film thickness along the column direction immediately after ink application caused by factors such as variation in ink ejection amount and non-ejection of ejection openings in ink application is reduced during the period T1.

In step S622, the vacuum pump 600 is further driven to reduce pressure in the chamber 500 from atmospheric pressure to P2. As illustrated in FIG. 6, in the present embodiment, pressure in the chamber 500 is reduced to 10 Pa (P2) during the period T2, which is approximately 60 seconds or less in duration and starts from the end of the period T1, at which pressure in the chamber 500 has been reduced to P1. That is, P2 is set to pressure lower than VPmin, which is vapor pressure of solvent having the lowest vapor pressure among the plurality of kinds of solvents included in the ink.

In the pressure reduction process performed during the period T2, a rapid air flow from inside to outside the chamber 500, where the support base 700 is located, occurs during the period T2, which is 30 seconds and 120 seconds in duration and starts from the end of the period T1, as illustrated in FIG. 5. In accordance with this air flow, vapor of the solvent evaporated from the ink applied to the substrate 100x is exhausted from above the substrate 100x to the outside of the chamber 500, mainly during the period T2.

This can, through rapidly reducing vapor concentration of atmosphere surrounding the substrate 100x, promote evaporation of the solvent of the ink from the partitioned region 10a on the substrate 100x, and suppress movement in the column direction of the ink in the gaps 522z of the substrate 100x caused by imbalance of ink surface tension in the gaps 522z. That is, through maintaining low vapor concentration of atmosphere surrounding substrate 100x after elapse of a predefined time period after ink application, effects of ink convection in column application regions on the substrate caused by imbalance of ink surface tension can be reduced. As a result, luminance unevenness across the display 10 caused by nonuniformity of film thickness of the light emitting layers 123 in the peripheral portion and the central portion of the film forming area of the display panel 10 can be improved.

That is, in the present embodiment, as described above, in terms of a relationship between the period T1 and the period T2, where pressure in the chamber 500 is represented as $10^X$ Pa (where X indicates a real number), an average of a change amount of a value of X per unit time during the period T2 has a greater absolute value than an average of a change amount of a value of X per unit time during the period T1. This enables, during the time period T1, reduction of variation in film thickness along the column direction immediately after ink application caused by factors such as variation in ink ejection amount and non-ejection of ejection openings in ink application. This further enables, during the period T2, reduction of effects of ink convection in column application regions on the substrate caused by imbalance of ink surface tension.

Next, pressure in the amber 500 is reduced until the pressure falls to a predefined reference value, is maintained equal to or less than the reference value, and solvent in applied ink is evaporated as the ink is dried. More specifically, in step S623, the vacuum pump 600 is further driven to reduce pressure in the chamber 500 from P2 to P3, and then the substrate 100x is left in the chamber 500 in a heated state or a non-heated state. In the present embodiment, as illustrated in FIG. 6, the light emitting layers 123 are formed through: reducing pressure in the chamber 500 to 1 Pa (P3, $10^0$ Pa, X=0) during a period of approximately 130 seconds or less from the start of the period T2; further continuing pressure reduction until pressure in the chamber 500 falls to the third pressure P3 or less; and applying a baking treatment to the substrate 100x on the support base 700 in a low vacuum state in which pressure of atmosphere in the chamber 500 is equal to or lower than the third pressure P3. The baking treatment is performed by baking under predefined conditions (vacuum baking at a heating temperature of approximately 150° C. for approximately 60 min).

When baking is complete, gas is introduced into the chamber 500 (step S624), the support base 700 is moved outside the chamber 500 by the drive unit (not illustrated), transferring the substrate 100x on which the light emitting layers 123 are formed out of the chamber 500 (step S625) and completing the ink drying process.

(5) Forming the Electron Transport Layer 124, the Counter Electrode Layer 125, and the Sealing Layer 126

Figure 8D:
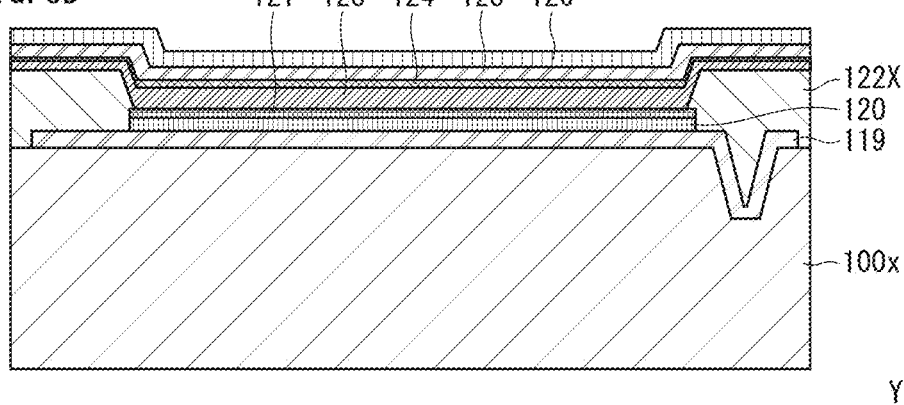

As illustrated in FIG. 8D, the electron transport layer 124 is formed using vacuum deposition or the like in the gaps 522z and on the column banks 522Y as a solid film (step S70). The counter electrode layer 125 and the sealing layer 126 are layered in this order covering the electron transport layer 124 as solid films in the gaps 522z and the column banks 522Y (steps S80 and S90). The counter electrode layer 125 and the sealing layer 126 can be formed by using chemical vapor deposition (CVD), sputtering, or the like.

(6) Forming CF Substrate 131

Next, the CF substrate 131 is formed (step S100). FIG. 11A to FIG. 11D are schematic cross sections showing states in manufacturing the CF substrate 131 in manufacture of organic EL display panel 10.

Figure 11A:
FIG. 11A to FIG. 11D are schematic cross sections showing states in manufacturing CF substrate 131 in manufacturing organic EL display panel 10.
Figure 11B:
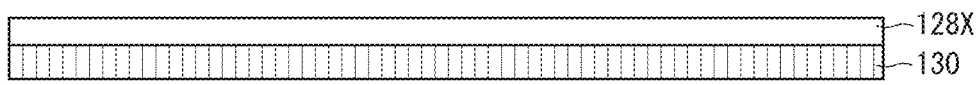
Figure 11C:
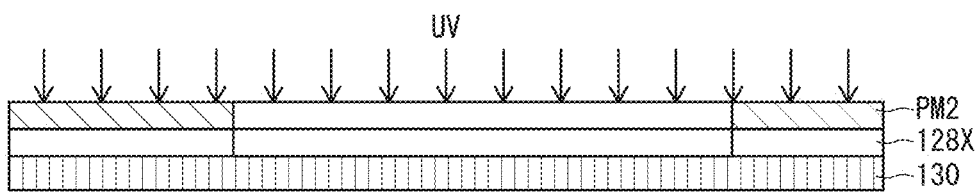
Figure 11D:
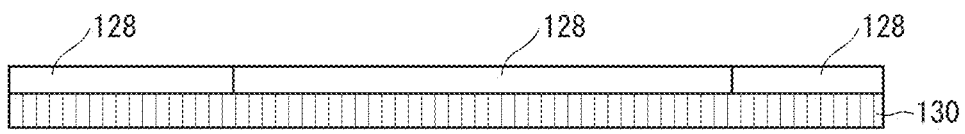
Figure 11D:
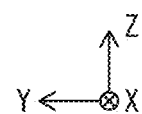

In forming the CF substrate 131, first, a light transmissive upper substrate 130 is prepared (FIG. 11A). Next, on a surface of the upper substrate 130, material of the color filter layer 128 (for example, G) that has an ultraviolet light curing resin as a primary component is dispersed in a solvent and applied as a paste 128X (FIG. 11B). After removal of a certain amount of solvent, a predefined pattern mask PM2 is placed and ultraviolet light irradiation is performed (FIG. 11C). Subsequently, curing is performed, the pattern mask PM2 and uncured paste 128X are removed and developing is performed to form the color filter layer 128(G) (FIG. 11D). The color filter layer 128(R) and 128(B) is formed by repeating the processes of FIG. 11B to FIG. 11D for color filter material of the respective color. Instead of using the paste 128X, a commercially available color filter product may be used.

(7) Joining of CF Substrate 131 and Back Panel

The following describes joining of the CF substrate 131 and the back panel (step S110).

Figure 12A:
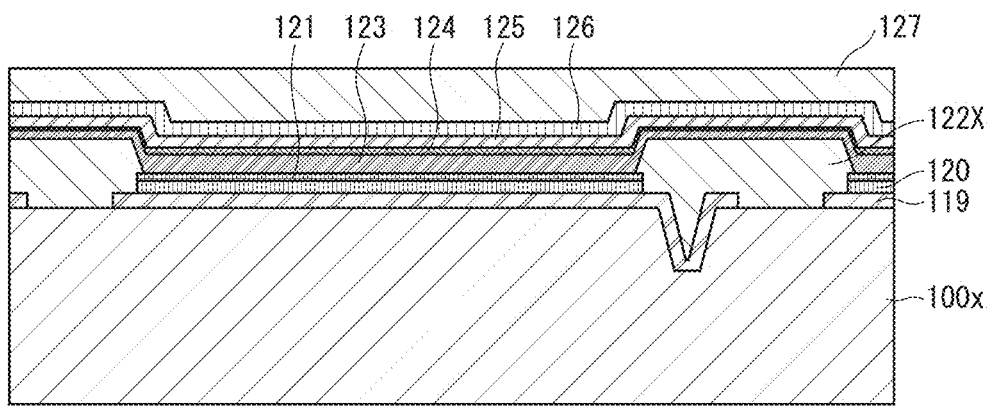
FIG. 12A and FIG. 12B are schematic cross sections taken at the same position as Y1-Y1 in FIG. 2, showing states in which CF substrate 131 and a back panel are adhered together in manufacture of organic EL display panel 10.

In this process, first, material of the joining layer 127, which mainly includes ultraviolet light curing resin such as acrylic resin, silicone resin, epoxy resin, or the like, is applied to the back panel, which comprises every layer from the substrate 100*x* to the sealing layer 126 (FIG. 12A).

Figure 12B:
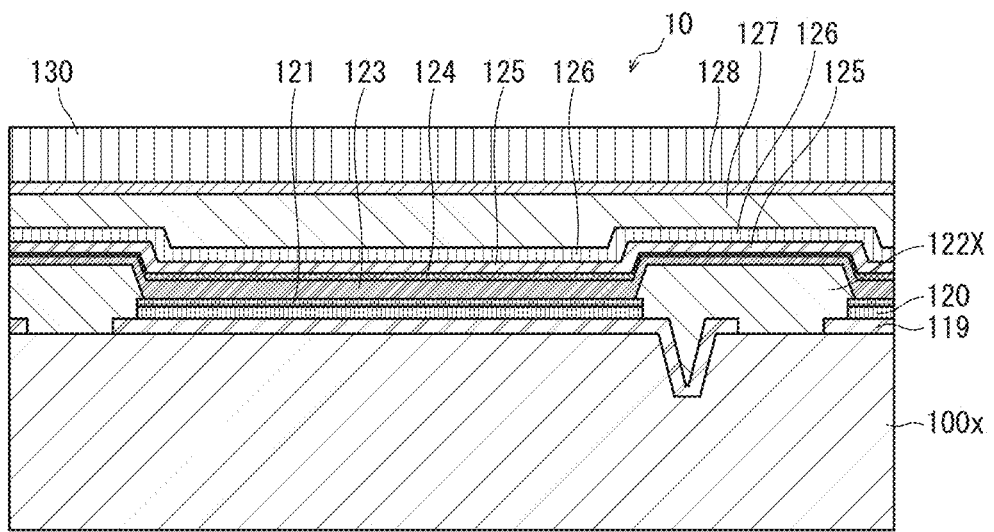
Figure 12B:
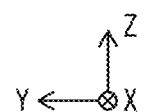

Subsequently, the applied material is irradiated with ultraviolet light, and the back panel and the CF substrate 131 are joined while matching positions relative to each other. At this time, care is taken to avoid gas entering between the back panel and the CF substrate 131. Subsequently, when the back panel and the CF substrate 131 are baked and a sealing process is complete, the display panel 10 is completed (FIG. 12B).

5. Effects of Ink Drying Process

The following describes effects that can be obtained by the method of manufacturing the display panel 10.

5.1 Film Thickness Evaluation Examination

Figure 13:
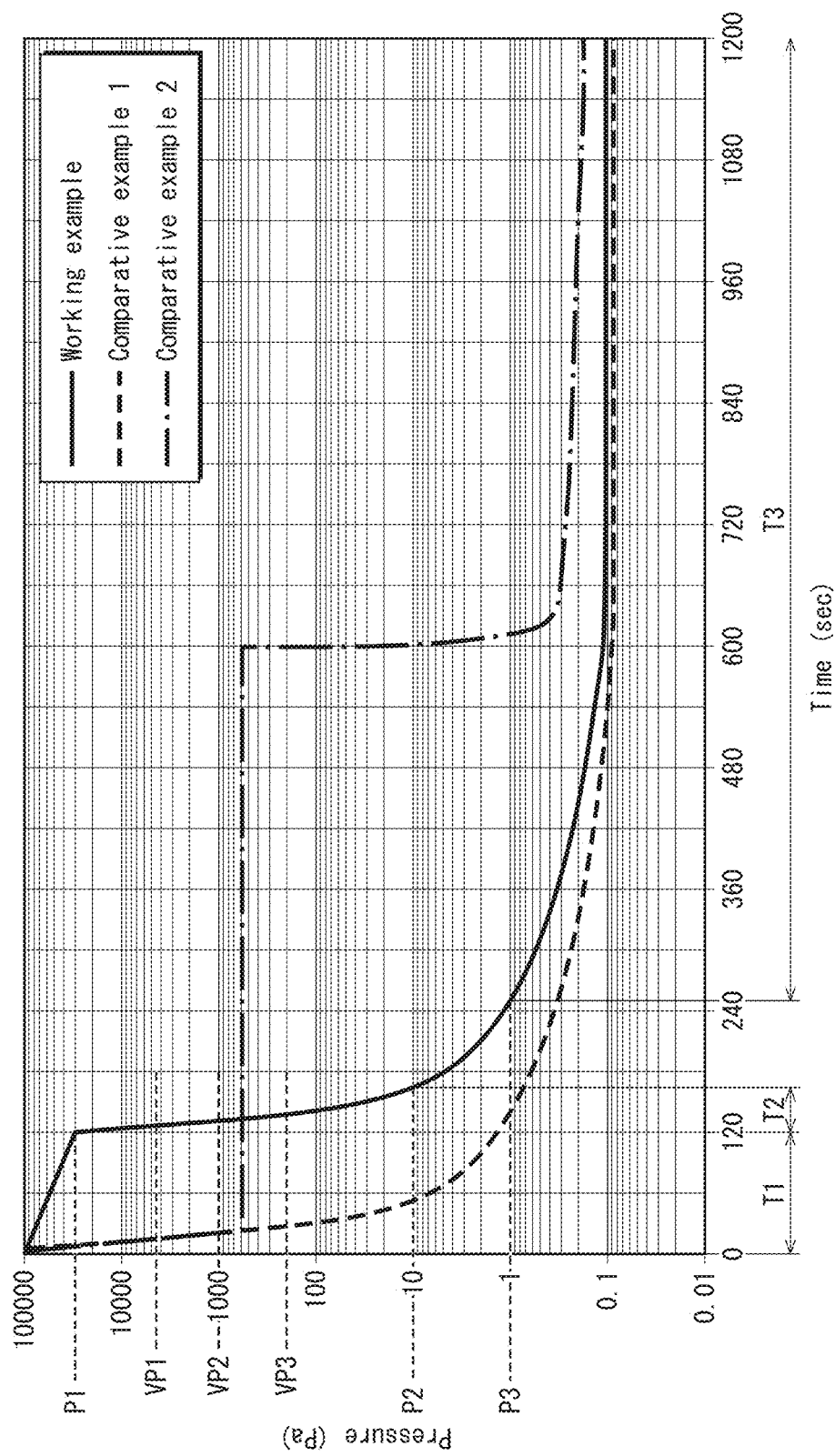
FIG. 13 is a graph of change over time of pressure in a chamber in the ink drying process of a working example and comparative examples 1 and 2.
Figure 14:
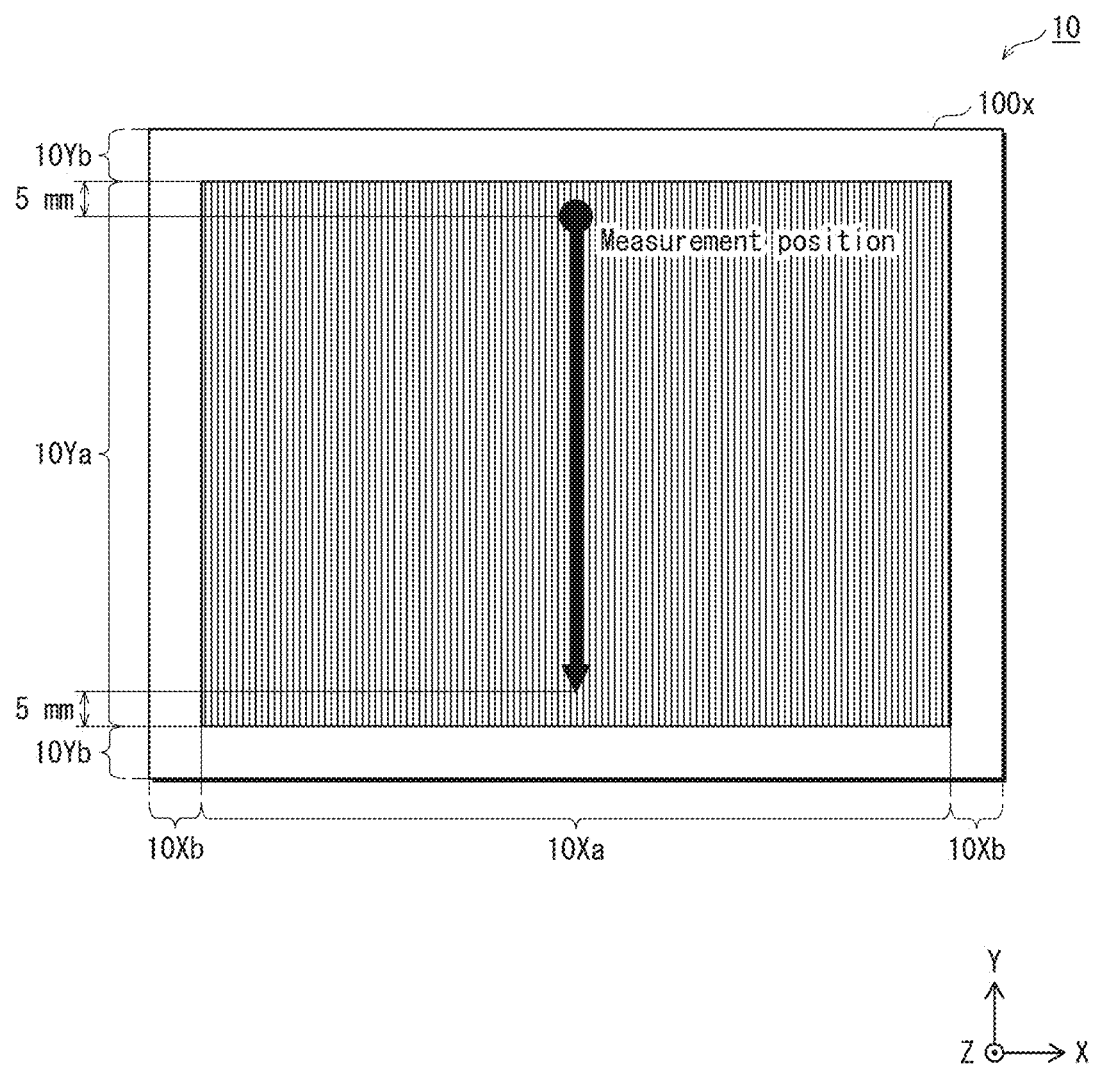
FIG. 14 is a schematic plan view illustrating a position at which film thickness is measured.

The inventors measured distribution of film thickness of the light emitting layers 123 in the display panel 10. FIG. 13 is a graph of change over time of pressure in the chamber in the ink drying processes of a working example and comparative examples 1 and 2, and FIG. 14 is a schematic plan view showing film thickness measurement positions. In the present experiment, for the working example of the display panel 10, distribution of film thickness of the light emitting layers 123 on the substrate 100*x* on a center line in the X direction in the partitioned region 10*a* was measured from a column direction end 522Ye to a column direction end 522Ye of the column banks 522Y.

(1) Samples to be Tested

The following describes specifications of the working example and the comparative examples 1 and 2.

The working example is a display panel 10 manufactured by using an ink drying device 900 in which change over time of pressure in the chamber in the ink drying process shows a profile in FIG. 6.

The comparative example 1 is a display panel manufactured by using an ink drying device which, in the ink drying process, rapidly reduces pressure in the chamber 500 from standard atmospheric pressure $1 \times 10^5$ Pa to approximately 10 Pa (P2) within 60 seconds from a start of pressure reduction, then to approximately 1 Pa (P3) within 150 seconds from the start of pressure reduction, and then to approximately 0.1 Pa within around 600 seconds from the start of pressure reduction.

The comparative example 2 is a display panel manufactured by using an ink drying device which, in the ink drying process, rapidly reduces pressure in the chamber 500 from standard atmospheric pressure $1 \times 10^5$ Pa to approximately 450 Pa within 30 seconds from a start of pressure reduction, and maintains pressure of approximately 450 Pa until 600 seconds pass from the start of pressure reduction. 450 Pa is pressure that is within the range of vapor pressure of the plurality of kinds of solvents that can be used for the ink and that is lower than the maximum vapor pressure VPmax and higher than the minimum vapor pressure VPmin. Subsequently, pressure in the chamber 500, by using the ink drying device, is reduced to 1 Pa (P3) within 30 seconds from when 600 seconds elapse after the start of pressure reduction, and then is reduced to approximately 0.1 Pa around 900 seconds from the start of pressure reduction, to form a display panel.

(2) Measurement Results

Figure 15A:
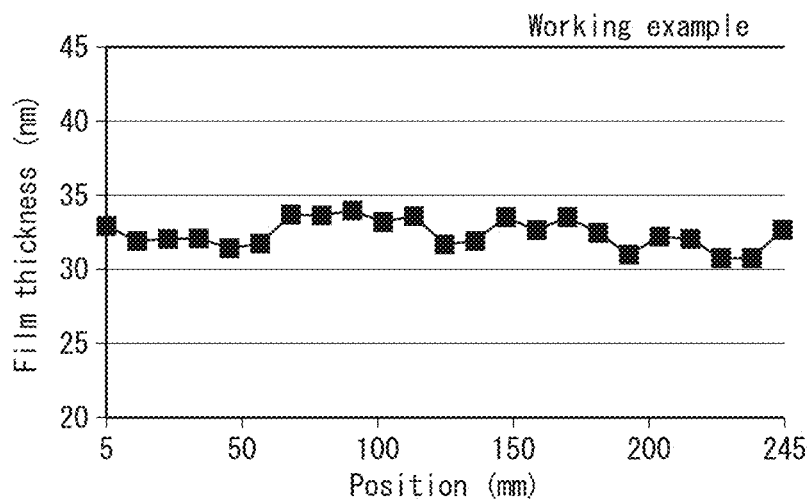
FIG. 15A to FIG. 15C are graphs of measured film thickness results for the working example and the comparative examples 1 and 2.
Figure 15B:
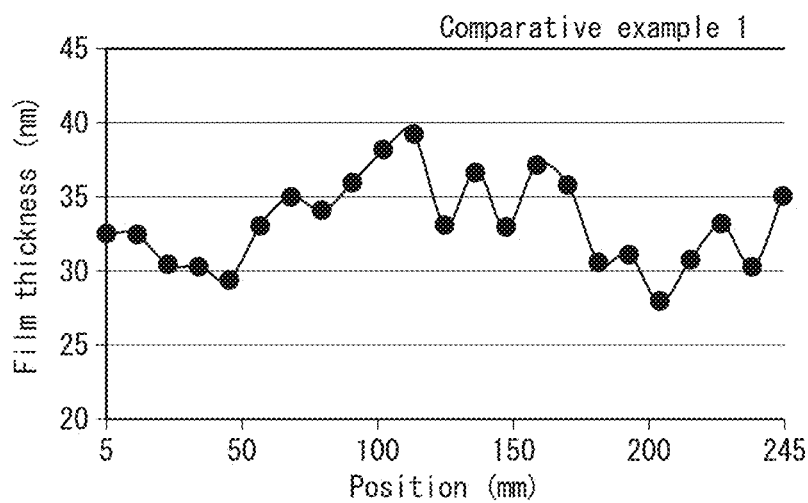
Figure 15C:

FIG. 15A to FIG. 15C are graphs of measured film thickness results for the working example and the comparative examples 1 and 2 of the display panel 10.

In the comparative example 1, as illustrated FIG. 15B, film thickness at a position approximately 45 mm from an upstream end of the column banks 522Y (position 5 mm) is at most 10 nm less than film thickness at a position approximately 110 mm from the upstream end of the column banks 522Y. Further, at a position approximately 200 mm from the upstream end of the column banks 522Y, film thickness is at most 12 nm less than film thickness at a position approximately 100 mm from the upstream end of the column banks 522Y. Further, in the comparative example 1, film thickness variation in a range from the upstream end to a downstream end of the column banks 522Y is at most 12 nm.

In the comparative example 2, as illustrated in FIG. 15C, film thickness at a position approximately 5 mm from an upstream end of the column banks 522Y (position 5 mm) is at most 12 nm less than film thickness at a position approximately 40 mm from the upstream end of the column banks 522Y. Further, at a position approximately 150 mm from the upstream end of the column banks 522Y, film thickness is at most 8 nm less than film thickness at a position approximately 200 mm from the upstream end of the column banks 522Y. Further, in the comparative example 2, film thickness variation in the range from the upstream end to a downstream end of the column banks 522Y is at most 12 nm.

Meanwhile, in the working example of the display panel 10, as illustrated in FIG. 15A, film thickness variation in the range from an upstream end to a downstream end of the column banks 522Y is only about 3 nm at most.

The above results indicate that uniformity of film thickness of the functional layers in column application regions along the gaps 522YZ between adjacent ones of the column banks 522Y is improved in the working example of the display panel 10 compared to the comparative examples 1 and 2.

5.2 Factors Causing Variation in Ink Film Thickness

The following are factors causing variation in film thickness of the light emitting layers 123 obtained from the display panel 10.

A) Local film thickness variation immediately after ink application caused by variation in ink ejection amount between ejection openings As illustrated in FIG. 9, in the ink jet method used in the present embodiment, the substrate 100*x* is placed on a work table of a droplet ejecting device in a state in which the column banks 522Y extend along the Y direction, and an inkjet nozzle head 622 in which ejection openings 624*dl* are arranged in a line along the Y direction is scanned across the X direction while ink aimed at deposition targets set in the gaps 522*z* between the column banks 522Y is deposited from the ejection openings 624*dl*. Typically, ink amounts ejected from the ejection openings 624*dl* arranged in a line differ from each other. Further, ink ejection from one or more of the ejection openings 624*dl* may be suspended in accordance with an ejection quality test performed in advance. This gives rise to film thickness unevenness along the gaps 522*z* caused by factors such as variation in ink ejection amount between the ejection openings 624*dl* and non-ejection from the ejection openings 624*dl*. Such film thickness unevenness is more prominent immediately after ink application. Such film thickness unevenness caused by variation in ink ejection amount reduces as time elapses, because such film thickness unevenness is leveled through movement in the column direction of the ink in the gaps 522*z*.

B) Film thickness variation caused by vapor concentration distribution of ink solvent in central and peripheral portions of a substrate in row and column directions of the substrate With respect to a wet film-forming process of forming a functional layer by a method of applying ink to a substrate and drying the ink, the inventors studied variation in film shape due to differences in drying speed between a central portion of a display region and a peripheral portion of the display region on the substrate.

Figure 16A:
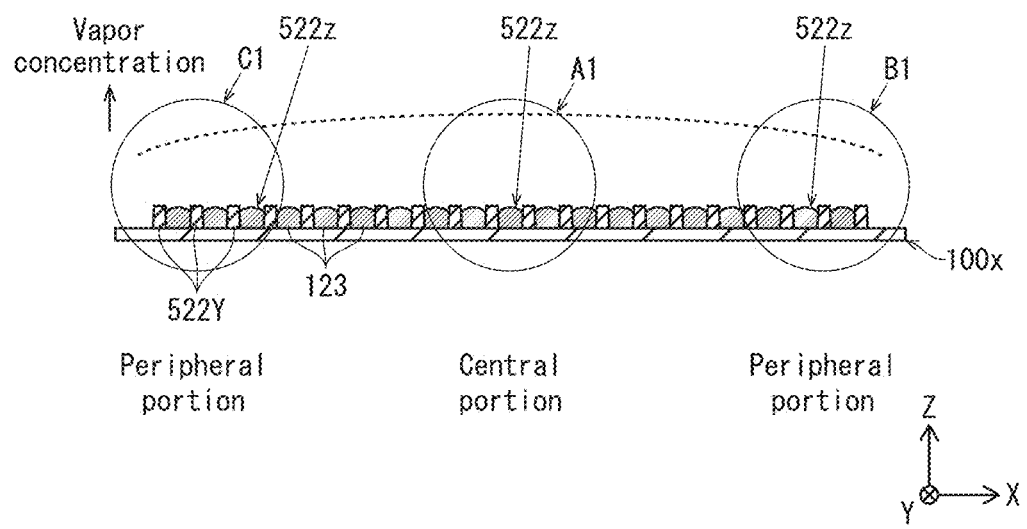
FIG. 16A and FIG. 16B are diagrams of differences in film shape between a central portion of a display region and a peripheral portion of the display region for the comparative example 1.
Figure 16B:
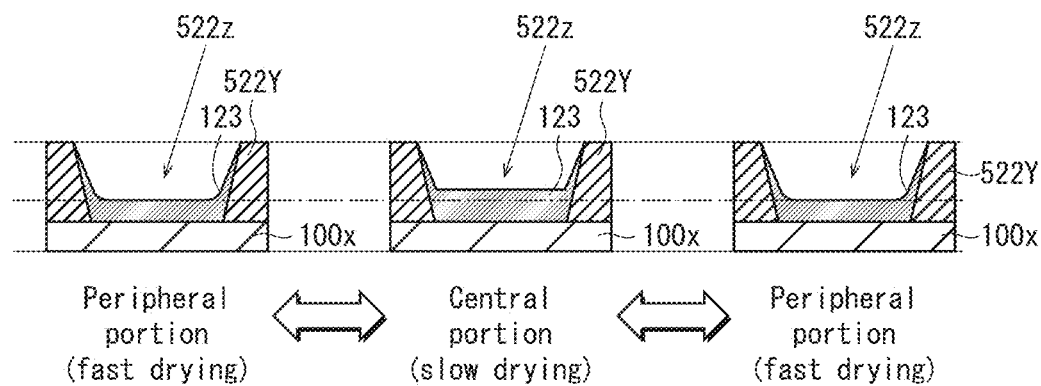

FIG. 16A and FIG. 16B are diagrams of differences in film shape between a central portion of a display region and a peripheral portion of the display region. In FIG. 16A, 100x indicates the substrate, and 522Y indicates column banks provided on the substrate 100x, adjacent ones of the column banks 522Y defining the gaps 522z. 123 indicates ink applied to the gaps 522z for the purpose of forming light emitting layers. As illustrated in FIG. 16B, when fabricating elements in which height of the column banks 522Y is uniform across a plane, comparing sub pixels of a central portion A1 of a display region for which ink solvent vapor concentration is high and drying is slow and sub pixels of a peripheral portion B1 or C1 of a display region for which ink solvent vapor concentration is relatively low and drying is fast, positioned near an edge of the partitioned region 10a, the light emitting layers 123 are thinner in the vicinity of side walls and thicker at pixel centers.

This is because, in the central portion A1 for which drying is slow, a solid component of ink of the light emitting layers 123 sediments and moves to the bottom of the gaps 522z in the process of solvent evaporating. Due to this, film thickness at the bottom is increased. In the central portion A1, in comparison with the peripheral portions B1 and C1, in the process of solvent evaporating, the solid component of ink of the light emitting layers 123 sediments and moves to the bottom of the gaps 522z, thus increasing film thickness at the bottom.

Thus, in a configuration in which film forming is performed through a wet film-forming process, film thickness variation occurs due to imbalance in solvent evaporation rate due to vapor concentration distribution of ink solvent between a central portion and a peripheral portion of the substrate in the row and column directions thereof.

Figure 17A:
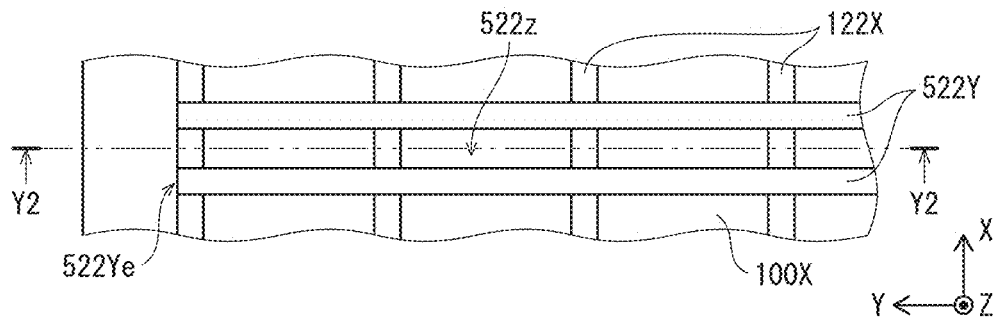
FIG. 17A is a schematic plan view around column bank end portions for the comparative example 1.
Figure 17B:
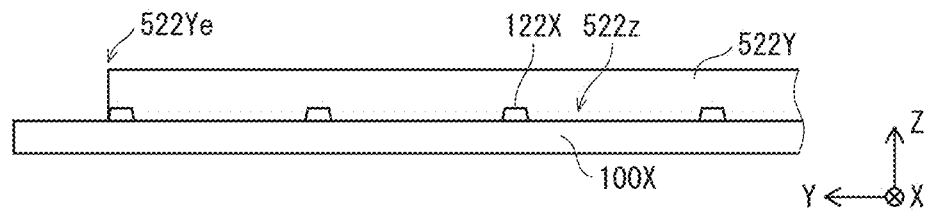
FIG. 17B is a schematic cross section taken along Y2-Y2 in FIG. 17A.
Figure 17C:
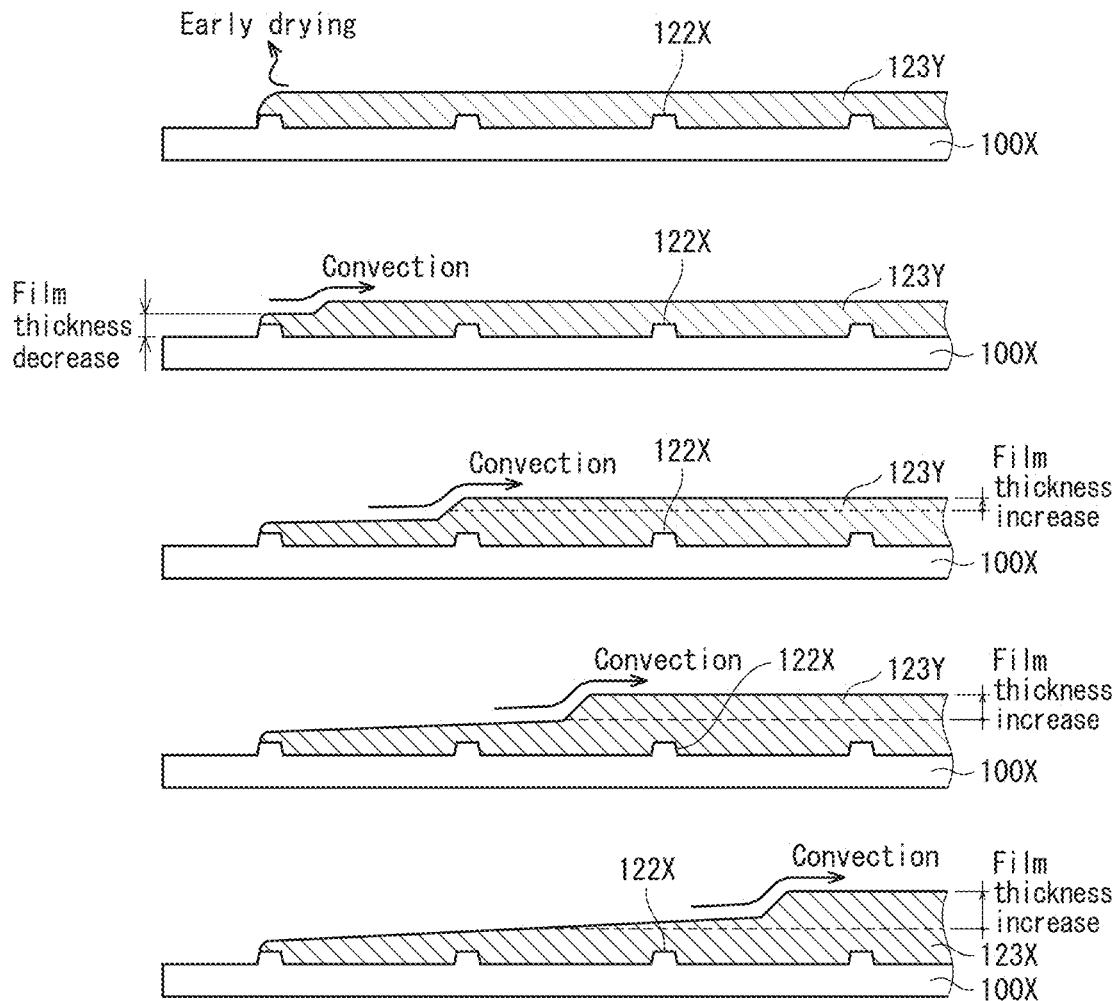
FIG. 17C shows schematic cross sections showing changes in film thickness over time.

C) Film thickness variation caused by imbalance surface tension between central and peripheral portions of a substrate in the column direction FIG. 17A is a schematic plan view of the substrate 100x in the vicinity of the ends 522Ye of the column banks 522Y on the substrate 100x, and FIG. 17B is a schematic cross section taken along Y2-Y2 of FIG. 17A. FIG. 17C includes schematic cross sections taken along Y2-Y2 of FIG. 17A, showing changes in film thickness of the light emitting layer 123Y over time. As illustrated in FIG. 17A and FIG. 17B, the column banks 522Y and the row banks 122X are provided on the substrate 100x.

As illustrated in FIG. 17C, for ink of the light emitting layer 123Y applied in the gaps 522z on the substrate 100x, drying of the solvent starts from the end 522Ye of the column banks 522Y. This is because, as described above, in a wet film-forming process, in the process of evaporating and drying the solvent of the ink, solvent vapor pressure is lower in a peripheral portion of a film forming area than in a central portion thereof, and therefore an evaporation rate of the solvent is greater. A film forming area is an area in which ink is applied by a wet film-forming process, and is the same region as the partitioned region 10a in FIG. 1. Thus, as evaporation of the solvent proceeds due to drying, evaporation of the solvent is slower for ink inwards of the ends 522Ye for which remaining solvent is greater per unit area than for ink in the vicinity of the ends 522Ye for which remaining solvent is less per unit area, causing nonuniform surface tension. Ink in the vicinity of the ends 522Ye is pulled inward by the surface tension from the ink inward of the ends 522Ye, causing ink convection directed inwards. As a result, ink in the vicinity of the ends 522Ye moves inwards, and ink film thickness inwards of the ends 522Ye increases.

Figure 18:
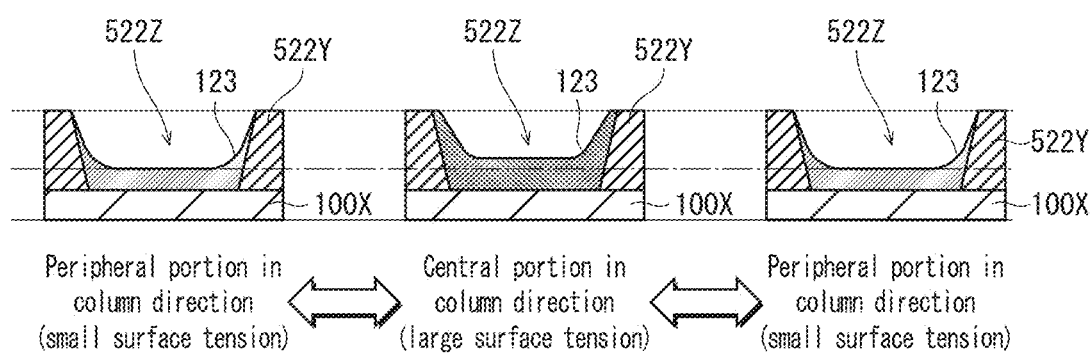
FIG. 18 is a schematic diagram of film shape for the comparative example 1 of organic EL display panel 10.

FIG. 17C includes upper (earlier) and lower (later) stages, and as illustrated in FIG. 17C, drying of the solvent gradually progresses inwards from the ends 522Ye over time, and ink film thickness inwards of the ends 522Ye also gradually increases due to the movement of ink in this direction. Eventually, ink film thickness reaches a maximum in a central portion of the film forming area, and as illustrated in FIG. 18, film shape of the light emitting layers 123Y formed also have a maximum film thickness in the central portion in the column direction of the film forming area.

Thus, in a configuration in which film forming is performed through a wet film-forming process, film thickness variation occurs due to imbalance in ink surface tension between a central portion and a peripheral portion in the column direction.

5.3 Analysis of Film Thickness Measurement Results

The following is an analysis of the film thickness measurement results for the light emitting layers 123 obtained from the display panel 10.

(1) Regarding Comparative Example 1

For the comparative example 1, the results show that film thickness variation in a range of the column banks 522Y is at most 12 nm, which is a value greater than in the working example. This is because, mainly due to factor A described above, film thickness unevenness caused by variation in ink ejection amount immediately after ink ejection is prevented from being equalized in the gaps 522z forming the column application regions.

As described above, the comparative example 1 adopts a pressure profile such that, in the ink drying process, pressure in the chamber 500 is rapidly decreased from standard atmospheric pressure $1 \times 10^5$ Pa to approximately 10 Pa (P2) within 60 seconds from the start of pressure reduction. 10 Pa is pressure lower than VPmin, which is the lowest vapor pressure in the range of vapor pressure of the plurality of kinds of solvents included in the ink. Due to rapid pressure reduction to P2, the plurality of kinds of solvents included in the ink applied to the substrate 100x rapidly evaporate within 60 seconds from the start of pressure reduction. As described above, film thickness unevenness caused by factors such as variation in ink ejection amount between the ejection openings 624dl and non-ejection from the ejection openings 624d occur. Such film thickness unevenness is more prominent immediately after ink application. In the comparative example 1, evaporation of the solvents included in the ink progresses before the ink in the gaps 522z moves in the column direction and film thickness unevenness is leveled, and thus movement of the ink in the column direction in the gaps 522z is restricted and film thickness unevenness caused by variation in ink ejection amount immediately after ink ejection is prevented from being equalized.

(2) Regarding Comparative Example 2

For the comparative example 2, the results show that film thickness variation in the range of the column banks 522Y is at most 12 nm, which is a value greater than in the working example. This is because, mainly due to factors B and C described above, film thickness variation due to ink convection caused by imbalance in ink surface tension in the gaps 522z forming the column application regions has increased.

As described above, the comparative example 2 adopts a pressure profile such that, in the ink drying process, pressure in the chamber 500 is rapidly decreased from standard atmospheric pressure $1\times10^5$ Pa to approximately 450 Pa within 30 seconds from a start of pressure reduction, and subsequently the pressure of approximately 450 Pa, which is included in the range of vapor pressure of the plurality of kinds of solvents that can be used for the ink, is maintained until 600 seconds elapse after the start of pressure reduction. The pressure approximately 450 Pa is lower than the maximum vapor pressure VPmax and higher than the minimum vapor pressure VPmin. Drying of the solvent in the ink applied in the gaps 522z forming the column application regions gradually progresses inwards from the ends 522Ye over time due to factor B described above. Further, due to factor C described above, ink film thickness inwards of the ends 522Ye also gradually increases due to the movement of ink in this direction. Here, through maintaining pressure of atmosphere within the range of vapor pressure of the plurality of kinds of solvents for a predefined period of time, evaporation of the solvents of the ink from inside the gaps 522z of the substrate 100x is suppressed and the ink in the gaps 522z is allowed to move in the column direction for a long period of time. As a result, movement of the ink due to imbalance in ink surface tension in the gaps 522z is promoted.

That is, occurrence of ink convection in column application regions on the substrate caused by imbalance of ink surface tension is allowed for a long period of time through maintaining pressure of atmosphere surrounding the substrate 100x around vapor concentration of the atmosphere until a predefined time period elapses after ink application. As a result, nonuniformity of film thickness of the light emitting layers 123 in the peripheral portion and the central portion of the film forming area of the display panel 10 increases.

(3) Regarding Working Example

For the working example, the results show that film thickness variation in the range of the column banks 522Y is at most 3 nm, which is a value smaller than in the comparative examples 1 and 2. This is because: mainly due to reduction of effects of factor A described above, film thickness unevenness caused by variation in ink ejection amount immediately after ink ejection is decreased in the gaps 522z forming the column application regions; and mainly due to reduction of effects of factor C described above, film thickness variation due to ink convection caused by imbalance in ink surface tension is reduced in the gaps 522z forming the column application regions.

Figure 19A:
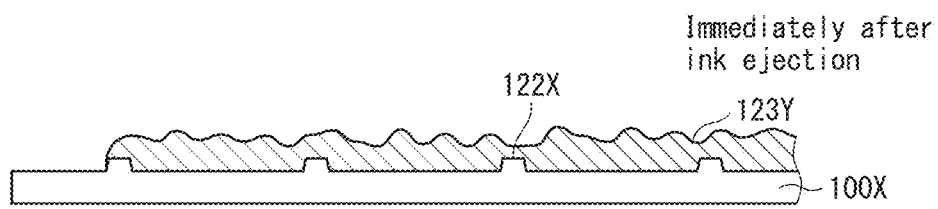
FIG. 19A to FIG. 19D are each a schematic diagram of film shape of the working example of the organic EL display panel 10.
Figure 19B:
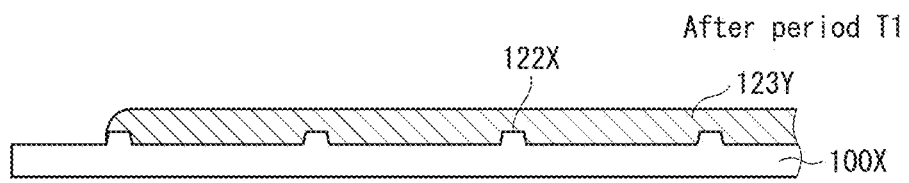
Figure 19C:
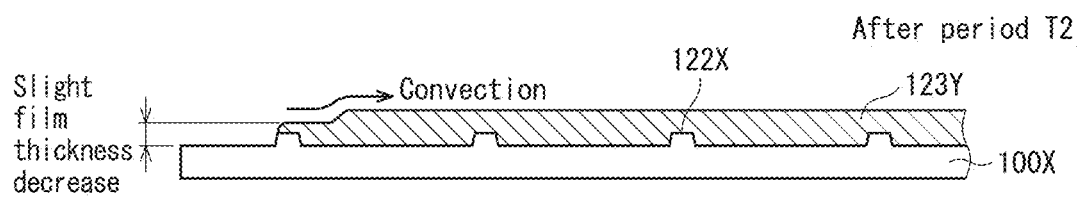

FIG. 19A to FIG. 19D is a schematic diagram of film shape for the working example of the organic EL display panel 10. The working example adopts a pressure profile such that pressure in the chamber 500 is first reduced during the period T1 from standard atmospheric pressure $1\times10^5$ Pa to P1, which is higher than VPmax (vapor pressure of solvent having the highest vapor pressure among the vapor pressure VP1, VP2, . . . VPn of the plurality of kinds of solvents included in the ink). Due to this, evaporation of the ink from the partitioned region 10a on the substrate 100x is suppressed through maintaining high vapor concentration of atmosphere surrounding the substrate 100x. Accordingly, as illustrated in FIG. 19A, film thickness unevenness in the gaps 522z forming the column application regions caused by variation in ink ejection amount occurs immediately after ink ejection. However, because movement in the column direction of the ink in the gaps 522z of the substrate 100x is allowed, the ink in the gaps 522z moves in the column direction and film thickness unevenness is leveled during the period T1 (FIG. 19B). As a result, variation in film thickness along the column direction immediately after ink application caused by factors such as variation in ink ejection amount and non-ejection of ejection openings in ink application is thought to be reduced.

Further, the working example adopts a pressure profile such that, after the period T1 elapses, pressure in the chamber 500 is reduced to P2, which is lower than VPmin (vapor pressure of solvent having the lowest vapor pressure among the vapor pressure VP1, VP2, . . . VPn of the plurality of kinds of solvents included in the ink), within the period T2 from the beginning of reduction of pressure during the period T2. Due to rapid pressure reduction to P2, the plurality of kinds of solvents included in the ink applied to the substrate 100x rapidly evaporate within the period T2 from the beginning of reduction of pressure during the period T2. Due to this, movement in the column direction of the ink in the gaps 522z of the substrate 100x is suppressed, and thus movement of the ink due to imbalance of ink surface tension in the gaps 522z is suppressed. That is, through reducing vapor concentration of atmosphere surrounding the substrate 100x to P2, which is lower than VPmin (vapor pressure of solvent having the lowest vapor pressure among the vapor pressure VP1, VP2, . . . VPn of the plurality of kinds of solvents included in the ink), within a short time period after elapse of a predefined time period after ink application, a time period during which column application regions on the substrate is affected by ink convection caused by imbalance of ink surface tension between the central portion and the peripheral portion is limited within the period T2 in FIG. 19C. That is, reduction of nonuniformity of film thickness of the light emitting layers 123 in the peripheral portion and the central portion of the film forming area of the display panel 10 is helped through shortening time length during which ink convection caused by imbalance of ink surface tension occurs.

Figure 19D:
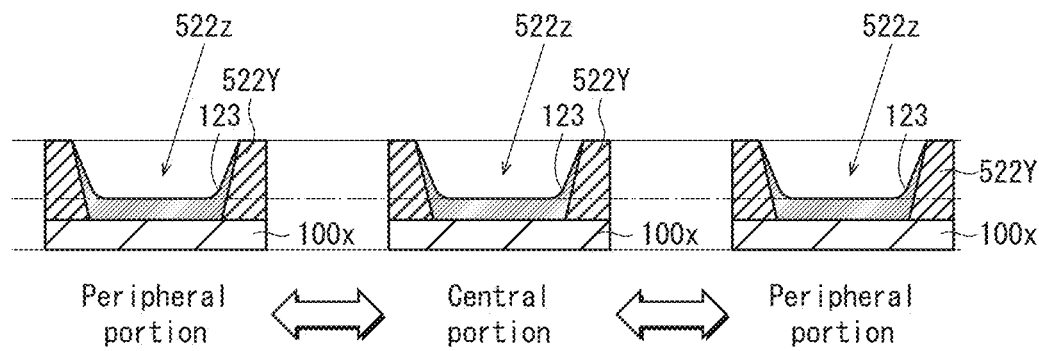

As described above, in the working example, due to reduction of effects of factors A and C described above, film shape of the light emitting layers 123 to be formed becomes accordingly more equivalent in both the peripheral portion and the central portion of the film forming area than the comparative examples 1 and 2 in FIG. 19D.

That is, the present embodiment achieves reduction of variation in film thickness along the column direction immediately after ink application caused by factors such as variation in ink ejection amount and non-ejection of ejection openings in ink application. Further, when manufacturing an organic EL display panel through applying ink including a functional organic material in the column application regions on the substrate, effects of ink convection in the column application regions caused by imbalance of ink surface tension can be reduced through shortening time length during which such ink convection occurs. As a result, according to the method of manufacturing an organic EL display panel 10 including the ink drying process using the ink drying device 900 pertaining to the present embodiment, improvement can be made to uniformity in the column application regions on the substrate with respect to film thickness difference of the light emitting layers in the peripheral and the central portions of the film forming area, and thus improvement can be made to luminance unevenness caused by nonuniformity of film thickness.

6. Summary

As described above, a method of manufacturing an organic EL display panel pertaining to Embodiment 1 of the present disclosure includes forming pixel electrode layers in a matrix on a substrate. In the method, the matrix includes rows and columns. The method further includes arranging column banks, which extend in a column direction, above the substrate along a row direction. In the method, at least a part of each of the column banks is between corresponding edges of adjacent pixel electrode layers in the row direction. The method further includes applying ink including solute and two or more kinds of solvents to gaps between adjacent column banks. In the method, the applied ink is continuous between column direction ends of the column banks in the column direction, and the solute includes a functional organic material. The method further includes exhausting gas from atmosphere surrounding the substrate. The method further includes drying the ink through placing the substrate in a state in which pressure of the atmosphere is equal to or lower than a predefined pressure. In the method, the drying forms organic functional layers. The method further includes forming a light-transmissive counter electrode layer above the organic functional layers. In the method, the exhausting of gas includes: reducing, during a first period, pressure of the atmosphere from standard atmospheric pressure to a first pressure that is higher than vapor pressure of solvent having the highest vapor pressure among the solvents; and reducing, during a second period after the first period, pressure of the atmosphere to a second pressure that is lower than vapor pressure of solvent having the lowest vapor pressure among the solvents. In the method, where pressure of the atmosphere is represented as $10^X$ Pa (where X indicates a real number), an average of a change amount of a value of X per unit time during the second period has a greater absolute value than an average of a change amount of a value of X per unit time during the first period. According to an embodiment of the method, the first period is from 30 seconds to 300 seconds and starts from a start of pressure reduction of the atmosphere. According to an embodiment of the method, the period may be from 30 seconds to 120 seconds and start from an end of the period. According to an embodiment of the method, the first pressure may be pressure selected from a range from $1\times10^4$ Pa to $3\times10^4$ Pa ($10^{4.47712}$ Pa). According to an embodiment of the method, the second pressure may be 10 Pa.

According to the method of manufacturing an organic EL display panel 10 of the above configuration, film shape of the light emitting layers 123 to be formed becomes equivalent in both a peripheral portion and a central portion of a film forming area. That is, in a display panel manufactured through applying ink including a functional organic material in column application regions on the substrate, variation in film thickness along the column direction immediately after ink application caused by variation in ink ejection amount is reduced through levelling. Further, when manufacturing the organic EL display panel through applying ink including a functional organic material in the column application regions on the substrate, effects of ink convection in the column application regions caused by imbalance of ink surface tension can be reduced through shortening time length during which such ink convection occurs. As a result, improvement can be made to luminance unevenness caused by nonuniformity of film thickness of the light emitting layers 123 of the display panel 10 by equalizing film thickness of the light emitting layers in the column application regions on the substrate in order to overcome film thickness difference of the light emitting layers in peripheral and central portions of the film forming area.

7. Modifications

The display panel 10 according to the embodiment has been described, but the present invention is not limited to the embodiment above. For example, various modifications of embodiments conceived by a person having ordinary skill in the art, and any combination of elements and functions of embodiments and modifications that does not depart from the spirit of the present invention are also included in the present invention. The following describes, as an example, a method of manufacturing a display panel 10 by using an ink drying device pertaining to a modification.

According to the method of manufacturing the display panel 10 by using the ink drying device 900 pertaining to the modification, in the ink drying process, the rectifying plate that has through holes with uniform density, is arranged at a predefined distance from the column banks, facing the substrate with the ink applied. However, shape of the rectifying plate is not limited to the example above, and may be appropriately changed.

The ink drying device 900 may include a rectifying plate (not illustrated) arranged opposite the substrate 100x, separated from the column banks 522Y on the substrate 100x by a predefined distance, and a spacer (not illustrated) for holding the rectifying plate at the predefined distance from the column banks 522Y opposite the substrate 100x. Here, the rectifying plate may be made of a ceramic or a metal having solvent resistance, such as stainless steel, aluminum, copper, iron, or the like, and may have through holes. The rectifying plate is preferably configured to be movable in both directions along the Z axis above the support base 700 via an elevation unit (not illustrated). The spacer may be a gap forming unit made of metal columns provided in the vicinity of an outer periphery of the support base 700. When the rectifying plate moves downward via the elevation unit and comes close to the support base 700, the spacer preferably holds the rectifying plate and thereby regulates the gap between the support base 700 and the rectifying plate at a predefined distance.

Further, according to a modification, the rectifying plate may have peripheral wall surrounding a region of a surface of the rectifying plate facing the column banks 522Y, and when viewing the substrate 100x in plan view, the peripheral wall may surround the column banks 522Y.

This configuration can reduce effects of factor B described above, and therefore film thickness variation caused by imbalance in solvent evaporation rate due to vapor concentration distribution of ink solvent between a central portion and a peripheral portion of the substrate in the row and column directions thereof can be further reduced or substantially eliminated.

Also, film thickness variation occurring due to imbalance in ink surface tension between a central portion and a peripheral portion in the column direction is improved in the modification in comparison with the working example. This is because film thickness variation caused by ink solvent vapor concentration distribution between the central portion and peripheral portion of the substrate is decreased, and therefore imbalance in ink surface tension in the column shaped application region is further decreased in the modification.

As a result, further improvement can be made to luminance unevenness caused by nonuniformity of film thickness of the light emitting layers 123 in peripheral and central portions of the film forming area.

<<Other Modifications>>

(1) Regarding the embodiment, no description was provided specifying the number of sheets of the display panel 10 formed simultaneously from one substrate in mass production of the display panel 10. However, in mass production of the display panel 10, when multiples of the display panel 10 are formed from one substrate, each partitioned region 10a of each display panel 10 is of course one film forming area. This is because, even in the case of multiples of the display panel 10 being formed from one substrate, when adjacent film forming areas (partitioned regions 10a) are separated from each other by at least a predefined distance, solvent vapor pressure in a peripheral portion of each film forming area is less than in a central portion thereof.

(2) According to the embodiment above, as illustrated in FIG. 1, in the display panel 10, the non-light emitting region 10ne is formed without the organic EL display elements 100 in a predefined number of sections from the outer edge of the partitioned region 10a on the substrate 100x. However, the pixel electrode layers 119 may be provided in each section on the substrate 100x as the display element region 10e, as far as the ends 522Ye of the column banks 522Y. Therefore, effectively utilizing the film formation area on the substrate, enlarging the display element region 10e, and consequently contributing to cost reduction are possible.

(3) According to the display panel 10, colors of light emitted by the light emitting layers 123 of sub pixels 100se in the gaps between the column banks 522Y that are adjacent in the row direction are different from each other, and color of light emitted by the light emitting layers 123 of sub pixels 100se in the gaps between the row banks 122X that are adjacent in the column direction the same. However, the color of light emitted by the light emitting layers 123 of sub pixels 100se that are adjacent in the row direction may be the same, and colors of light emitted by the light emitting layers 123 of sub pixels 100se that are adjacent in the column direction may be different. Alternatively, for both the column and row directions, colors of light emitted by the light emitting layers 123 of sub pixels 100se that are adjacent may be different. Even according to this configuration, luminance unevenness caused by distribution of ink solvent vapor concentration can be reduced.

(4) Other

According to the display panel 10 pertaining to the embodiment, there are three colors of the pixels 100e: red pixels, green pixels, and blue pixels, but the present invention is not limited to this example. For example, there may be only one color of light emitting layer, or there may be four colors of light emitting layer such as red, green, blue, and yellow.

Further, according to the embodiment described above, the pixels 100e are arranged in a matrix shape, but the present invention is not limited to this. For example, when the pixel regions are spaced at one pitch, the effects of the present invention are achieved even when the pixel regions are shifted by a half pitch in the column direction between adjacent gaps. In high definition display panels, visually distinguishing slight shifts in the column direction is difficult even if film thickness unevenness on a straight line (or staggered line) having a certain width is lined up, as the shifts in the column direction are visually recognized as a band shape. Accordingly, improving display quality of a display panel, suppressing luminance unevenness, by using a staggered line arrangement is possible.

Further, according to the display panel 10, the pixel electrode layers 119 are disposed in all of the gaps 522z, but the present invention is not limited to this configuration. For example, gaps 522z in which the pixel electrode layers 119 are not formed may exist, for the purpose of forming a bus bar, or the like.

Further, according to the embodiment above, the hole injection layers 120, the hole transport layers 121, the light emitting layers 123, and the electron transport layer 124 are present between the pixel electrode layers 119 and the counter electrode layer 125, but the present invention is not limited to this. For example, a configuration may be used in which only the light emitting layers 123 are present between the pixel electrode layers 119 and the counter electrode layer 125, without using the hole injection layers 120, the hole transport layers 121, and the electron transport layer 124. Further, for example, a configuration may be used in which hole injection layers, hole transport layers, an electron transport layer, an electron injection layer, or the like is present, and a configuration may be used in which some or all of these layers are present. Further, at least one of these layers need not be made of organic compounds, and a configuration may be used in which an inorganic compound is used.

Further, according to the embodiment above, a wet film-forming process such as printing, spin coating, inkjets, or the like is used as a method of forming the light emitting layers 123, but the present invention is not limited to these examples. For example, a dry process can be used such as vacuum deposition, electron beam deposition, sputtering, reactive sputtering, ion plating, vapor phase growth, or the like. Further, publicly-known materials may be appropriately used as materials of each component.

According to the embodiment above, a configuration is used in which pixel electrode layers 119, which are anodes in a lower portion of EL elements, are connected to TFT sources, but a configuration may be used in which a counter electrode layer is in the lower portion of an EL element and an anode is disposed in an upper portion. In such a case, a cathode disposed in a lower portion is connected to a drain of the TFT.

Further, according to the embodiment above, a top-emission type of EL display panel is given as an example, but the present invention is not limited to this. For example, a bottom-emission type of display panel or the like can be used. In such a case, each configuration can be changed appropriately.

<<Supplement>>

The embodiments described each include a beneficial example of the present invention. Values, shapes, materials, components, component positions and connections, processes, process order, and the like illustrated by the embodiments do not indicate limitations of the present invention. Further, among the elements of the embodiments, processes not described in the independent claims that recite top level concepts of the present invention are described as elements of a more beneficial form.

Further, the order of processes described above are examples for the present invention, and may be different from the order described above. Further, a part of the processes described above may be executed simultaneously (in parallel) with another process.

Further, in order to facilitate understanding of the present invention, scale of the elements in each of the drawings mentioned for the embodiment above may be different from actual scale. Further, the present invention is not limited by the description of the embodiment, and can be appropriately changed without departing from the scope of the present invention.

Further, at least part of the functions of the embodiments and various modifications thereof may be combined.

Further, the present invention includes various modifications of the embodiments that may be conceived of by a person having ordinary skill in the art.

INDUSTRIAL APPLICABILITY

The method of manufacturing the organic EL display panel pertaining to the present invention, and the ink drying device using same, are widely useful in manufacture of television sets, personal computers, portable telephones, and the like, as well as in manufacture of electronic devices that includes a process of forming a functional layer by using an ink application process.

REFERENCE SIGNS LIST 10 organic EL display panel
100 organic EL display element
100e unit pixel
100se sub pixel
100a auto light emitting region
100b non-auto light emitting region
100x substrate (TFT substrate)
119 pixel electrode layer
119b contact region (contact window)
119c connecting recess
120 hole injection layer
121 hole transport layer
122 insulating layer
122X row bank
522Y column bank
123 light emitting layer
124 electron transport layer
125 counter electrode layer
126 sealing layer
127 joining layer
128 color filter layer
130 upper substrate
131 CF substrate
500 chamber
500a opening
600 vacuum pump
700 support base
810 pressure sensor
820 control unit
900 ink drying device

The invention claimed is:

1. A method of manufacturing an organic electroluminescence (EL) display panel, the method comprising:
    forming pixel electrode layers in a matrix on a substrate, wherein the matrix comprises rows and columns;
    arranging column banks, which extend in a column direction, above the substrate along a row direction, wherein at least a part of each of the column banks is between corresponding edges of adjacent pixel electrode layers in the row direction;
    applying ink including solute and two or more kinds of solvents to gaps between adjacent column banks, wherein the applied ink is continuous between column direction ends of the column banks in the column direction, the solute including a functional organic material;
    exhausting gas from atmosphere surrounding the substrate;
    drying the ink through placing the substrate in a state in which pressure of the atmosphere is equal to or lower than a predefined pressure, wherein the drying forms organic functional layers; and
    forming a light-transmissive counter electrode layer above the organic functional layers, wherein
    the exhausting of gas comprises:
        reducing, during a first period, pressure of the atmosphere from standard atmospheric pressure to a first pressure that is higher than vapor pressure of solvent having the highest vapor pressure among the solvents; and
        reducing, during a second period after the first period, pressure of the atmosphere to a second pressure that is lower than vapor pressure of solvent having the lowest vapor pressure among the solvents, and
    where pressure of the atmosphere is represented as $10^x$ Pa (where X indicates a real number), an average of a change amount of a value of X per unit time during the second period has a greater absolute value than an average of a change amount of a value of X per unit time during the first period.

2. The method of claim 1, wherein
the first period is from 30 seconds to 300 seconds and starts from a start of pressure reduction of the atmosphere.

3. The method of claim 1, wherein
the second period is from 30 seconds to 120 seconds and starts from an end of the first period.

4. The method of claim 3, wherein
the second period is within 60 seconds and starts from the end of the first period.

5. The method of claim 1, wherein
the first pressure is selected from a range from $1 \times 10^4$ Pa to $3 \times 10^4$ Pa.

6. The method of claim 5, wherein
the exhausting of gas further comprises reducing, during a third period after the second period, pressure of the atmosphere to a third pressure or less, the third pressure being pressure such that a value of X is 0.

7. The method of claim 6, wherein
the predefined pressure is equal to or lower than the third pressure; and
the drying of the ink further comprises placing the substrate under the predefined pressure after the second period.

8. The method of claim 7, wherein
the drying of the ink further comprises heating the substrate under the predefined pressure.

9. The method of claim 7, wherein
the drying of the ink further comprises:
    placing the substrate under the predefined pressure; and
    subsequently heating the substrate under atmospheric pressure.

10. The method of claim 1, wherein
the second pressure is 10 Pa.

11. The method of claim 1, wherein
reduction of pressure of the atmosphere during the first period is a monotonous reduction, and
reduction of pressure of the atmosphere during the second period is a monotonous reduction.

* * * * *